(12) United States Patent
Witzman et al.

(10) Patent No.: US 6,367,414 B2
(45) Date of Patent: *Apr. 9, 2002

(54) LINEAR APERTURE DEPOSITION APPARATUS AND COATING PROCESS

(75) Inventors: Matthew R. Witzman, Rohnert Park; Richard A. Bradley, Jr.; Christopher W. Lantman, both of Santa Rosa; Eric R. Cox, Healdsburg, all of CA (US)

(73) Assignee: Flex Products, Inc., Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/758,839

(22) Filed: Jan. 10, 2001

Related U.S. Application Data

(63) Continuation of application No. 09/437,684, filed on Nov. 10, 1999, now Pat. No. 6,202,591.
(60) Provisional application No. 60/108,187, filed on Nov. 12, 1998.

(51) Int. Cl.$^7$ .......................... C23C 14/14; C23C 14/24; C23C 14/26
(52) U.S. Cl. ................... 118/723 VE; 118/726; 118/718
(58) Field of Search .................. 118/723 VE, 726, 118/718

(56) References Cited

U.S. PATENT DOCUMENTS

| | | | |
|---|---|---|---|
| 2,440,135 A | 4/1948 | Alexander | 117/106 |
| 2,793,609 A | 5/1957 | Shen et al. | 118/49 |
| 3,123,489 A | 3/1964 | Bolomey et al. | 106/291 |
| 3,330,647 A | 7/1967 | Hunt et al. | 75/93 |
| 3,725,045 A | 4/1973 | Roblin et al. | 75/93 |
| 3,989,862 A | 11/1976 | Butler et al. | 427/251 |
| 4,094,269 A | 6/1978 | Malinovski et al. | 118/49.1 |
| 4,229,066 A | 10/1980 | Rancourt et al. | 350/1.6 |
| 4,516,527 A | 5/1985 | Sugioka | 118/723 |
| 4,536,998 A | 8/1985 | Matteucci et al. | 52/171 |
| 5,167,984 A | 12/1992 | Melnyk et al. | 427/593 |
| 5,239,611 A | 8/1993 | Weinert | 392/388 |
| 5,272,298 A | 12/1993 | Taguchi et al. | 219/10.491 |
| 5,433,791 A | 7/1995 | Brewer et al. | 118/724 |
| 5,532,102 A | 7/1996 | Soden et al. | 430/128 |
| 5,648,165 A | 7/1997 | Phillips et al. | 428/346 |
| 5,677,065 A | 10/1997 | Chaussade et al. | 428/432 |
| 5,750,982 A | 5/1998 | Dokyi | 250/226 |
| 5,932,294 A | 8/1999 | Colombo et al. | 427/469 |
| 6,202,591 B1 * | 3/2001 | Witzman et al. | 118/723 VE |

FOREIGN PATENT DOCUMENTS

| | | |
|---|---|---|
| DE | 2612424 | 9/1977 |
| DE | 4027034 | 9/1991 |
| EP | 539099 | 4/1993 |
| EP | 652303 | 5/1995 |
| EP | 652302 | 10/1997 |
| GB | 683808 | 12/1952 |
| JP | 56051573 | 9/1981 |
| JP | 2-38396 | 2/1990 |
| JP | 3-109290 | 5/1991 |
| JP | 07090554 | 4/1995 |
| JP | 63-238264 | 10/1998 |

* cited by examiner

*Primary Examiner*—Jeffrie R. Lund
(74) *Attorney, Agent, or Firm*—Workman, Nydegger, & Seeley

(57) ABSTRACT

A linear aperture deposition apparatus and process are provided for coating substrates with sublimed or evaporated coating materials. The apparatus and process are particularly suited for producing flexible films having an optical interference coating with a very high surface thickness uniformity and which is substantially free of defects from particulate ejection of a source material. The apparatus includes a source box containing a source material, a heating element to sublime or evaporate the source material, and a chimney to direct the source material vapor from the source box to a substrate. A flow restricting baffle having a plurality of holes is positioned between the source material and the substrate to confine and direct the vapor flow, and an optional floating baffle is positioned on the surface of the source material to further restrict the vapor flow, thereby substantially eliminating source material spatter.

5 Claims, 20 Drawing Sheets

LINEAR APERTURE DEPOSITION APPARATUS AND COATING PROCESS

This continuation application claims the benefit of priority to U.S. patent application Ser. No. 09/437,684, filed Nov. 10, 1999, now U.S. Pat. No. 6,202,591 which claimed the benefit of priority to U.S. Provisional Application No. 60/108,187, filed on Nov. 12, 1998, the disclosure of which is herein incorporated by reference.

BACKGROUND OF THE INVENTION

1. Field of the Invention

The present invention relates generally to the field of vacuum deposition processes, and more particularly to a linear aperture deposition apparatus and coating process for coating wide substrate materials.

2. Relevant Technology

Optical interference coatings are useful for controlling the reflection, transmission and/or absorption of a selected wavelength range of light. These coatings consist of a plurality of alternating layers having a predetermined thickness less than the selected wavelength range. Additionally, the layers have a significant difference in refractive index and are controlled to a predetermined thickness. Suitable materials for optical interference coatings are primarily dielectric materials which have a refractive index range of about 1.4 to about 2.4, which is wavelength dependent, and a very small optical absorption coefficient. In some applications, thin layers of metal films, which have large absorption coefficients, are combined with the dielectric material layers.

The economical production of these coatings is frequently limited by the thickness uniformity necessary for the product, the number of layers, and the deposition rate of the coating materials. The most demanding applications generally require that the deposition occur in a vacuum chamber for precise control of the coating thickness and the optimum optical properties. The high capital cost of vacuum coating equipment necessitates a high throughput of coated area for large-scale commercial applications. The coated area per unit time is proportional to the coated substrate width and the vacuum deposition rate of the coating material.

A process that can utilize a large vacuum chamber has tremendous economic advantages. Vacuum coating chambers, substrate treating and handling equipment, and pumping capacity, increase in cost less than linearly with chamber size; therefore, the most economical process for a fixed deposition rate and coating design will utilize the largest substrate available. A larger substrate can generally be fabricated into discrete parts after the coating process is complete. In the case of products manufactured from a continuous web, the web is slit or sheet cut to either a final product dimension or a narrower web suitable for the subsequent manufacturing operations.

The manufacturing cost of the product is ultimately limited by the specific performance requirements that limit the maximum deposition rate. For example, if the required uniformity of coating on a continuous web or film is 1% or less over 12 inches of width, one would generally operate the source at the highest deposition rate, $R_{max}$, that could consistently yield the requisite 1% uniformity over the 12-inch width. If operation at that deposition rate degraded another specified characteristic, such as the maximum defect size, below a minimum acceptable value, then the deposition rate would be lowered to $R_1$, where $R_1 < R_{max}$.

Continuing with this example, further cost reduction could be achieved if the coating were deposited on substrates having widths that are multiples of 12 inches; i.e., 24 inches, 36 inches, etc. For example, if a 36-inch-wide source achieved 1% uniformity at deposition rate $R_1$, it would cost less to coat a 36-inch-wide substrate and slit it to a final width of 12 inches than to coat a 12-inch-wide substrate, because three times as much material would be produced by the wider coating machine. A wider coating machine would cost less than three times the cost of a 12-inch coating machine, perhaps only 50% more. However, this advantage would only be realized if the 36-inch source could deposit the coating with 1% uniformity over the entire 36-inch substrate width at a rate, $R_2$, which is greater than or equal to $R_1$, without exceeding the maximum defect size.

Therefore, in the case of continuous coating equipment, in which a substrate of a fixed width is transported over each source to deposit the coating design, simultaneously improving the uniformity of the source and the deposition rate without degrading the film properties, will have a profound economic benefit.

Two techniques are commonly used in the physical vapor deposition of coating materials. These are sputtering and thermal evaporation. Thermal evaporation readily takes place when a source material is heated in an open crucible within a vacuum chamber when a temperature is reached such that there is a sufficient vapor flux from the source for condensation on a cooler substrate. The source material can be heated indirectly by heating the crucible, or directly by a high current electron beam directed into the source material confined by the crucible.

Magnetron sputtering adapts well to coating wide substrates with metal layers. The length of the magnetron assembly is selected such that the sputtering racetrack exceeds the substrate width by several inches at each edge, wherein this central portion of the racetrack provides a uniformity in thickness that is typically less than about 5%. However, magnetron sputtering equipment is relatively expensive, is limited to materials that can be readily formed into solid targets, and has deposition rates that are generally inferior to those of thermal evaporation technologies, especially for metal compounds that are useful as optical coating materials.

A Knudsen cell evaporation source is an isothermal enclosure or crucible with a small orifice that confines the source material and requires the vapor to diffuse out of the orifice. The inside of the cell is large compared with the size of the orifice to maintain an equilibrium interior pressure.

The enclosed nature of the Knudsen cell reduces the likelihood that particulate ejected by the solid source material, commonly known as spatter, will reach the substrate either to cause damage or to be embedded therewithin. It is generally believed that such spatter is generated by the non-uniform heating of a granular or otherwise non-homogeneous source material whereby locally high pressures cause the ejection of the most friable portions of the source material. Spatter is severe in source materials with a low thermal conductivity and having retained moisture, air or other high vapor pressure components, and increases with the heating rate due to increased temperature differentials.

Thermal evaporation generally has been adapted to coating wide substrates by two methods. The most common method is to create a linear array of point sources, each point source being a small crucible having either a common or individual heating source. An alternative technique is to confine the source material in an elongated crucible and sweep an electron beam over the entire length of the crucible in order to uniformly heat the source material. A linear crucible must uniformly heat the coating material to achieve a uniform flux of coating material vapor across the entire substrate width.

The principle of a Knudsen cell has also been applied to coating wide areas. The cell enclosure is a tube or rectangle matching the width of the substrate and having a constricted slit along its entire length. Although a tubular Knudsen cell is easy to fabricate, it can be difficult to uniformly fill with solid source material, especially when the slit is relatively narrow with respect to the width of the source material particles. U.S. Pat. No. 5,167,984 to Melnyk et al., discloses further details optimizing a tubular Knudsen cell. The crucible has an open end suitable for alignment of a hollow cylindrical insert containing the source material. The source was designed and optimized for depositing chalcogenide photoconductive compounds and organic photoconductive materials.

U.S. Pat. No. 4,094,269 to Malinovski et al., discloses a tank-shaped source with a rectangular slot on its surface for the vapor deposition of silver halide compounds onto glass substrates and polyester substrates.

Prior art methods of depositing dielectric materials from either a series of electron beam point sources or linear crucibles have numerous limitations, especially for the economical production of optical interference coatings. They typically utilize less than about 15% of the source material evaporated, the balance of the source material being deposited on the coating chamber interior and masking fixtures. Both the chamber and masking fixtures must be cleaned periodically, resulting in lower utilization of the capital equipment capacity and higher material costs.

Masking fixtures are commonly used to correct for source non-uniformity in the direction transverse to the substrate's linear motion, a direction referred to herein as the "cross web direction". (The use of the term "cross web direction" is not meant to limit the present invention to plastic films or web products as the coated substrate.) The mask decreases the deposition rate further, to the minimum value along the source width.

Attempts to increase deposition rate by increasing source power input, such as electron beam current, result in either an unstable melt pool, or can further decrease the coating uniformity or increase the rate of particulate ejection, i.e., spatter, from solid or subliming and liquid materials. Either coating uniformity or surface quality considerations always limit the deposition rate.

The development of a linear source for the evaporation of higher refractive index materials has been a particularly elusive problem. While some successes have been obtained in depositing silicon monoxide and materials that sublime at a temperature less than about 900° C., this limits the available refractive index to a range from about 1.6 to about 1.9.

Many of the more useful high index materials in optical coatings, such as titanium dioxide, zirconium dioxide and niobium pentoxide require heating to a much higher temperature to obtain the necessary vapor pressure for vacuum coating, typically from about 1800° C. to greater than about 3500° C.

There have been specific attempts to adapt forms of linear crucible sources to coating flexible plastic film in a continuous roll form. That is, the substrate is continuously unwound in the vacuum chamber to transport it over the evaporation source(s), the substrate being disposed around a large cooling drum, where it is brought into the desired spatial proximity to the linear crucible.

In U.S. Pat. No. 5,239,611 to Weinert, a crucible device is disclosed wherein a plurality of radiant heaters is disposed above the material to be evaporated. A series of outlets between the radiant heaters are in vapor communication with material being evaporated.

European Patent Application Nos. EP 0652303 and EP 0652302 to Baxter et al., disclose linear crucible evaporation sources. Referring to FIG. 1A, a prior art apparatus 20 is shown which corresponds to the evaporation source disclosed in the Baxter applications. The apparatus 20 has an evaporator 22 and a chilled drum 24 which transports a web substrate 26 to be coated across a deposition zone 28. The evaporator 22 includes a crucible 30, which is heated from below by a heating element 32. The crucible 30 is contained in a retort 34 having a lid 36, wherein lid 36 has a plurality of outlet nozzles 38 disposed in arcuate conformance to chilled drum 24. Referring to FIGS. 1B and 1C, outlet nozzles 38 may be a plurality of holes or narrow slots oriented in the substrate transport direction, i.e., perpendicular to the long axis of the source.

A linear evaporation source for use in web coating equipment is available commercially from General Vacuum Equipment Corp. of Birmingham, England. A cross-sectional diagram of this source is provided in FIGS. 2A and 2B. Referring to FIG. 2A, a coating apparatus 40 includes a drum 42 and a source 44. The source 44 includes a crucible 46 containing a source material 48. Vaporized source material travels from crucible 46 to a deposition zone 50 via a chimney 52. A fixed monolithic insert 54 is placed between source material 48 and chimney 52 at the top of crucible 46. An enlarged view of crucible 46, insert 54 and chimney 52 is shown in FIG. 2B.

Furthermore, prior art methods of coating plastic films are frequently limited to specific substrates depending on the heating load of the source and the substrate's heat deformation temperature. This limits the choice of coating materials that can be evaporated and the maximum coating thickness. The coating thickness (per pass by coating source) is limited in that a minimum web speed must be exceeded to avoid overheating the substrate.

Continuous vacuum coating of plastic substrates requires numerous compromises to be made in product cost, composition, performance or quality due to deposition source technology. There has been an especially acute need for an efficient thermal evaporation source for coating plastic films with high refractive index optical material, i.e., a refractive index greater than about 1.7, and preferably greater than about 1.9.

Zinc sulfide (ZnS) is a useful high refractive index optical material in both visible and infrared wavelengths. Its relatively low sublimation temperature range, from about 1000° C. to about 1900° C., would suggest that it is an ideal material for plastic web coating, but it has two inherent material problems. The deposition temperature must be well-controlled to minimize the decomposition of ZnS to zinc and sulfur atoms in the vapor state. Dissociation results in a sub-stoichiometric film, having an excess of zinc, when the zinc and sulfur recombine to form a solid film. Sub-stoichiometric ZnS has undesirable optical absorption. Also the uncontrolled dissociation results in residual sulfur compounds on vacuum chamber components, most notably in the vacuum oil, and an undesirable odor. Further, chemical reactions of the excess sulfur may accelerate the deterioration of various vacuum components.

Thus, there is a need for efficient linear evaporation sources that do not suffer from the foregoing disadvantages.

SUMMARY AND OBJECTS OF THE INVENTION

It is an object of the present invention to provide an apparatus and process for uniform vacuum coating of wide substrates from source materials, primarily but not limited to metals and metallic compounds.

Another object of the present invention is to provide a sublimation and evaporative coating apparatus and process that satisfies the need for high and stable deposition rates, thickness control, high coating quality, and efficient use of the source materials.

Another object of the invention is to obtain a wide variety of functional and multilayer coatings without damage to temperature-sensitive substrates by radiation from the coating source materials and hot components.

A further object of the invention is to provide a coating source apparatus that is compact, being adaptable to a variety of substrate types and/or coating equipment configurations by adapting a cooperative arrangement of serial and/or parallel arrays of multiple sources.

Another object of the invention is to utilize a source material efficiently and obviate the need for uniformity control masking by depositing the coating on the substrate rather than the vacuum chamber.

Yet another object of the invention is to provide coatings having a high optical quality and being essentially free of defects from particulate ejected by the source material.

Still another object of the invention is to provide coatings having optical constants desirable for application in multilayer optical interference products, especially solar control films and light interference pigments, wherein a near bulk property refractive index is obtained without significant optical absorption.

Still another object of the invention is to provide a source that has a fast temporal response to changes in input power, permitting continuous control of the deposition rate and providing the economic advantages of a short time for heating up and cooling down.

In accordance with these and other objects, the present invention provides a linear aperture deposition apparatus and process for coating substrates with sublimed or evaporated coating materials. The apparatus includes a source box containing a source material, a heating element to sublime or evaporate the source material, and a chimney to direct the source material vapor from the source box to a substrate. The chimney has a rectangular vapor outlet slot for directing the source vapor from the source box to a wide substrate. A flow restricting baffle having a plurality of holes is positioned between the source material and the substrate to confine and direct the vapor flow, and an optional floating baffle is positioned on the surface of the source material to further restrict the vapor flow, thereby substantially eliminating source material spatter. The floating baffle is adapted to maintain its position on the upper surface of the source material, as the source material evaporates.

The floating baffle has openings that are arranged in a co-operative association with the flow restricting baffle holes to block particulate ejected from the source material. The foregoing elements are enclosed within a containment vessel adapted for conductive cooling, whereby excess heating of the substrate and other parts of the vacuum chamber are substantially prevented.

A process of the invention provides for physical vapor deposition of a source material onto a substrate utilizing the above described apparatus. A source material within a source box is heated such that the source material forms a vapor. The flow of vapor out of the source box is restricted in order to form a vapor plume substantially free of solid particulate source material. A substrate to be coated is transported across the vapor plume to cause the source material to coat the substrate. The process can be adapted such that the source material coats the substrate to form a continuous thin film. Such a film can be left intact or removed from the substrate to form particles such as substantially flat pigment particles.

The apparatus and process of the invention are particularly suited for producing flexible films having an optical interference coating with a very high surface thickness uniformity. In the field of solar control window film, the invention solves the problem of making multilayer coatings with acceptable uniformity, optical performance, and cost. The present invention also allows useful metal layers and dielectric layers of an optical coating to be deposited at high uniformity on a wide plastic web for the purpose of forming micron sized pigment particles, by removing the coating from the web.

Other objects and advantages of the present invention will become apparent from the following descriptions, taken in connection with the accompanying drawings, wherein, by way of illustration and example, various embodiments of the present invention are disclosed.

BRIEF DESCRIPTION OF THE DRAWINGS

In order to illustrate the manner in which the above recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

The present invention is directed to an apparatus and process for thermal evaporation and deposition of materials uniformly on wide substrates. The apparatus and process are especially applicable to the evaporation of materials that sublime, i.e., evaporate from a solid-state. During the sublimation of source materials, solid particles and particulate tend to be ejected, a phenomenon commonly known as spatter. This phenomenon causes defects in the coatings, and is usually avoided by maintaining the power below a critical threshold, hence limiting the deposition rate. The present invention provides essentially defect free coatings at very high deposition rates, wherein the detrimental effects of spattered particles and particulate are eliminated by the inventive source design.

As described in further detail below, the various embodiments of the invention provide a variety of evaporation source configurations to direct vapor flux upward, sideways and/or downward onto a substrate. The apparatus and process are readily scalable in the width of the coatings to match the substrate and/or deposit a requisite coating thickness without refilling the source between vacuum cycles.

A variety of heater configurations may be used with the evaporation source. The heater power supply and/or substrate drive are regulated by a control circuit responsive to a coating control monitor that measures a property of the coating, which is indicative of the film thickness. The novel features of the invention, which lead to high coating uniformity, also result in a rapid response to the heater power. This permits the use of source power as well as substrate transport speed (web speed) for temporal control of deposition rate, improving the down web uniformity, without a deterioration in cross web uniformity.

The evaporation source is constructed and used in a manner that facilitates rapid startup and cool down, thus improving cycle time. This is accomplished by the source having a fast temporal response to changes in input power, permitting continuous control of the deposition rate and providing the economic advantages of a short time for heating up (to the deposition temperature during start-up) and cooling down (for re-loading substrate and/or source material).

Figure 3A:
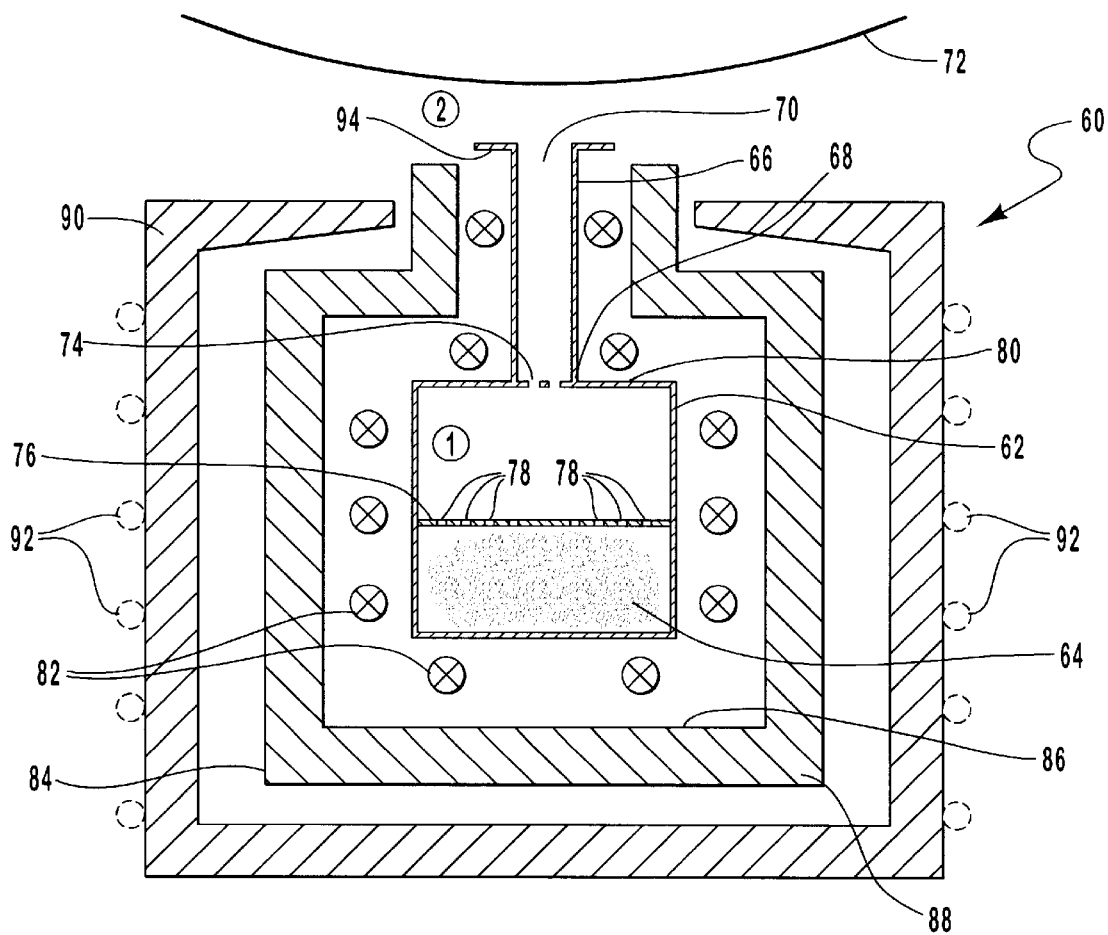
FIGS. 3A–3C are schematic depictions of a deposition apparatus according to one embodiment of the invention.
Figure 3B:
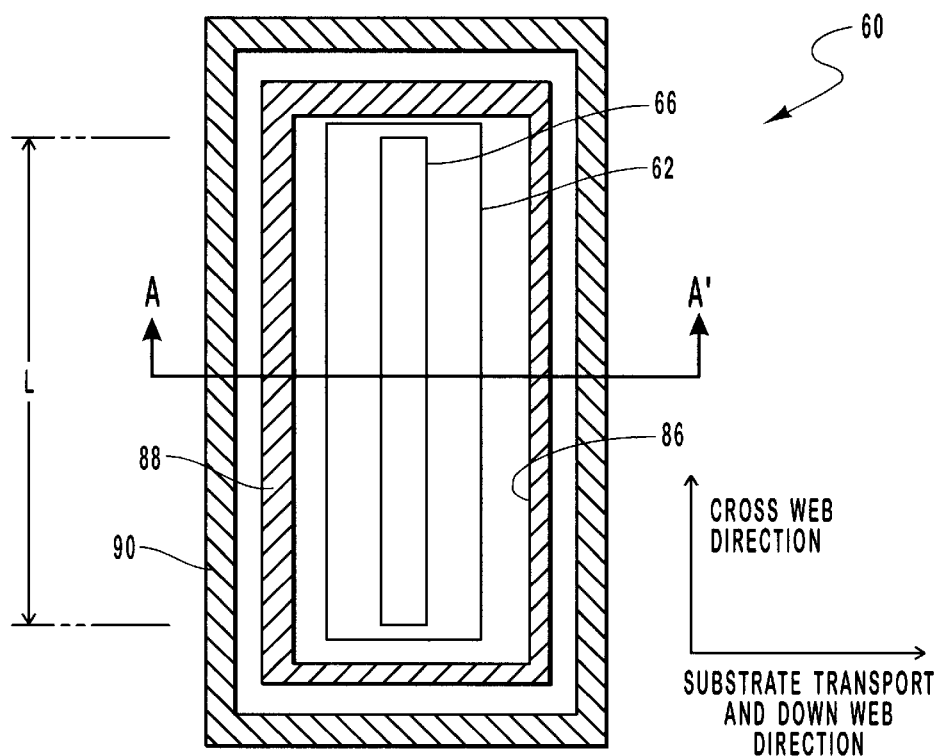
Figure 3C:
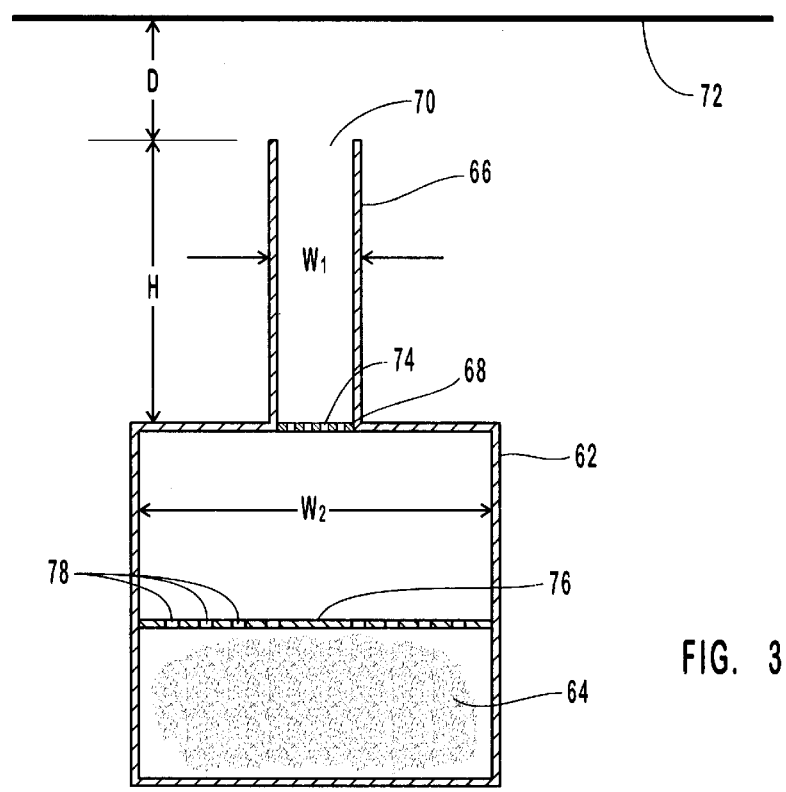

Referring to the drawings, wherein like structures are provided with like reference designations, FIGS. 3A–3C are schematic views of a deposition apparatus according to one embodiment of the invention. FIG. 3B is a plan view of the deposition apparatus, in which section line A–A' indicates the cross-sectional view depicted in FIG. 3A. The deposition apparatus includes a source 60 having a crucible 62 for containing a charge of source material 64, and a chimney 66 with a vapor inlet end 68 mounted on crucible 62. The chimney 66 has a rectangular vapor outlet slot 70 for directing source vapor from crucible 62 to a substrate 72. A flow-restricting baffle 74 is provided between chimney 66 and crucible 62 for blocking particulate ejected from source material 64. A floating baffle 76 having a plurality of holes 78 is provided within crucible 62. The floating baffle 76 is adapted to maintain its position on the upper surface of source material 64, as source material 64 sublimes. The holes 78 in floating baffle 76 are arranged in co-operative association with openings in flow restricting baffle 74 in order to block particulate ejected from source material 64. The crucible 62 has an upper surface or lid 80, which can be removed to insert or replace floating baffle 76 after refilling source material 64.

A heating element 82, such as resistive heating rods, surrounds crucible 62 and is adapted to uniformly heat source material 64 to an evaporation or sublimation temperature. The crucible 62 is contained within a source box 84 having an inner surface of a refractory metal heat shield 86 surrounding heating element 82. The source box 84 may also include an insulating material 88 enclosing heat shield 86. The source box 84 may be enclosed within a containment and cooling vessel 90. The vessel 90 has water cooling lines 92 on its outer surface, thus substantially preventing excess heating of substrate 72 and other parts of the vacuum chamber (not shown).

The coating process occurs in a vacuum chamber (not shown) adapted for substrate entry, transport and removal. The vacuum chamber may operate in a batch mode, wherein the entire substrate 72 is contained within the vacuum chamber during the entire compound coating and vacuum venting cycle. Alternatively substrate 72 may be introduced into the vacuum chamber continuously during the vacuum cycle and sequentially removed after coating. Continuous coating chambers introduce and remove substrate from either isolated air lock chambers or differentially pumped zones that have constrictions which conform to a planar substrate, such as a continuous web of plastic film or metal sheet.

During a coating cycle, source 60 operates in the following manner. The source material 64 is heated to the evaporation or sublimation temperature within a first region (①) in FIG. 3A) in the interior of crucible 62. This first region ① is defined by one or more baffles that restrict the flow of vapor into a second region ① in the FIG. 3A), whereby the restricted flow results in a significantly higher pressure in first region (②) than in second region ②. The first and second regions ① and ② are separated by a conduit, such as chimney 66, which confines and directs a plume of vapor onto substrate 72. The vapor plume that reaches substrate 72 is essentially free of particulate ejected by source material 64. The vapor flux within this plume is spatially and temporally uniform, with respect to a plane defined by the conduit width, due to the lower gas conductance through the conduit than within first region ①.

The floating baffle 76, which is disposed on top of the solid source material 64, and flow restricting baffle 74 between first and second regions ① and ② cooperate to reduce the gas conductance from region ①to region ② and also to intercept a large quantity of ejected particulate when source 60 is operated at the maximum temperature. The gas conductance difference is maintained as crucible 62 is emptied of source material 64, wherein the crucible volume filled with source material decreases from an initial value of about 98% to about 10% or less, over the course of a coating run.

The vapor outlet 70 at region ② may be placed close to substrate 72 to achieve efficient material utilization; i.e., substrate 72 is coated rather than the vacuum chamber walls, without any sacrifice in transverse uniformity. The substrate is not unduly heated by the source, since the narrow slit width at outlet 70 provides minimal direct infrared (IR) irradiation from the hot evaporation chamber.

The foregoing process can be carried out utilizing numerous variations in structural details and process conditions, examples of which are provided herein. In alternative embodiments, heating elements 82 may be within crucible 62, and may comprise one or more (IR) sources, such as IR lamps or SiC glow bars. Alternatively, the discrete heating element may be eliminated when the crucible functions as a resistive heating element, i.e., when the crucible is conductive and supplied with a current adapted to heat the crucible and source material, at the appropriate voltage for the crucible's electrical conductance. Alternatively, inductive heating may be used when the source material and/or crucible are conductive. Preferably, the heaters are arranged to provide uniform heating over the width of the source to obtain the best coating uniformity.

The inventive source design is surprisingly tolerant of non-uniform heating because flow restricting baffle 74 substantially equalizes any spatial variance in the vapor pressure within crucible 62, which would otherwise result in a correspondingly non-uniform vapor flux of source material 64 caused by local temperature variations within source material 64. Therefore, it is not essential to provide a large thermal mass, of either source material 64 or crucible 62, to obtain a consistent and uniform deposition rate. In fact, a low thermal mass source and heating element are advantageous, in that the source can be heated and cooled very rapidly, decreasing the non-productive cycle time when either reloading source material or replacing coated substrate with bare substrate.

In a currently preferred arrangement, molybdenum (Mo) heating rods are wrapped around the crucible. The preferred Mo heating rods have a 5 mm diameter and are typically provided with about 200 amps per 12 inches of linear width at 12 volts, which allows heating of zinc sulfide to approximately 1000° C., the useful sublimation temperature.

Depending on the material evaporated, chimney 66 may be heated, as shown in FIG. 3A, to reduce the material's sticking coefficient, thereby preventing the deposit of source material 64 along the interior walls of chimney 66 which would degrade the coating uniformity.

The heat shield 86 is preferably formed from an Mo sheet 0.02 inch thick, but can generally range from about 0.01 to about 0.05 inch thick, a sufficient thickness for dimensional stability, but avoiding a material thickness that would retain and radiate excess heat. The heat shield 86 is further insulated on the outer surface thereof by insulating material 88, such as a fibrous alumina board or a carbon felt composite material. The insulating material 88 is separated by vacuum away from and surrounded by containment and cooling vessel 90, such as a copper box. The temperature of this copper box is regulated by water cooling lines 92, which are attached coils continuously flushed with cooling water.

It has been surprisingly found that the present process and product can be optimized within the following range of structural dimensions of the source and their relationship to the substrate. FIG. 3C provides details of a portion of section A–A' in FIG. 3B, defining structural dimensions and parameters which are optimized in the more preferred embodiments of the invention. The distance from the top of vapor outlet slot 70 of chimney 66 to substrate 72 is designated as D. The height of chimney 66, i.e., the distance from vapor inlet end 68 to the top of vapor outlet slot 70 is designated as H. The width of chimney 66 is designated as W1 and the width of crucible 62 is designated as W2. FIG. 3B defines L, the length of vapor outlet slot 70 in the cross web direction, i.e., transverse to the direction of substrate transport (down web direction), as illustrated by arrows in FIG. 3B.

It has been surprisingly found that coating thickness uniformity in the direction transverse to substrate transport (the cross web direction) is optimized by the ratio of L/D. The ratio L/D is preferably greater than about 8, more preferably greater than about 16, and most preferably greater than about 32. The ratio of W2/W1 also contributes to optimum coating thickness uniformity. The down- and cross-web uniformity is improved when W2/W1 is preferably greater than about 3, more preferably greater than about 4, and most preferably greater than about 8. The ratio of H/W1 also contributes to cross web uniformity, as well as to down web uniformity. H/W1 is preferably greater than about 5, more preferably greater than about 8, and most preferably greater than about 20.

Not wishing to be bound by theory, we believe that a higher ratio of H/W1 contributes to the cross web uniformity. When H/W1 is large, there is a greater probability that molecules of source material vapor will collide with the chimney walls or with other molecules, equalizing regions of higher and lower pressure in the slot, and resulting in a directed vapor plume exiting the chimney. The source appears to be rather tolerant of non-uniform source material heating, which would normally result in a non-uniform vapor flux exiting the chimney.

Figure 4A:
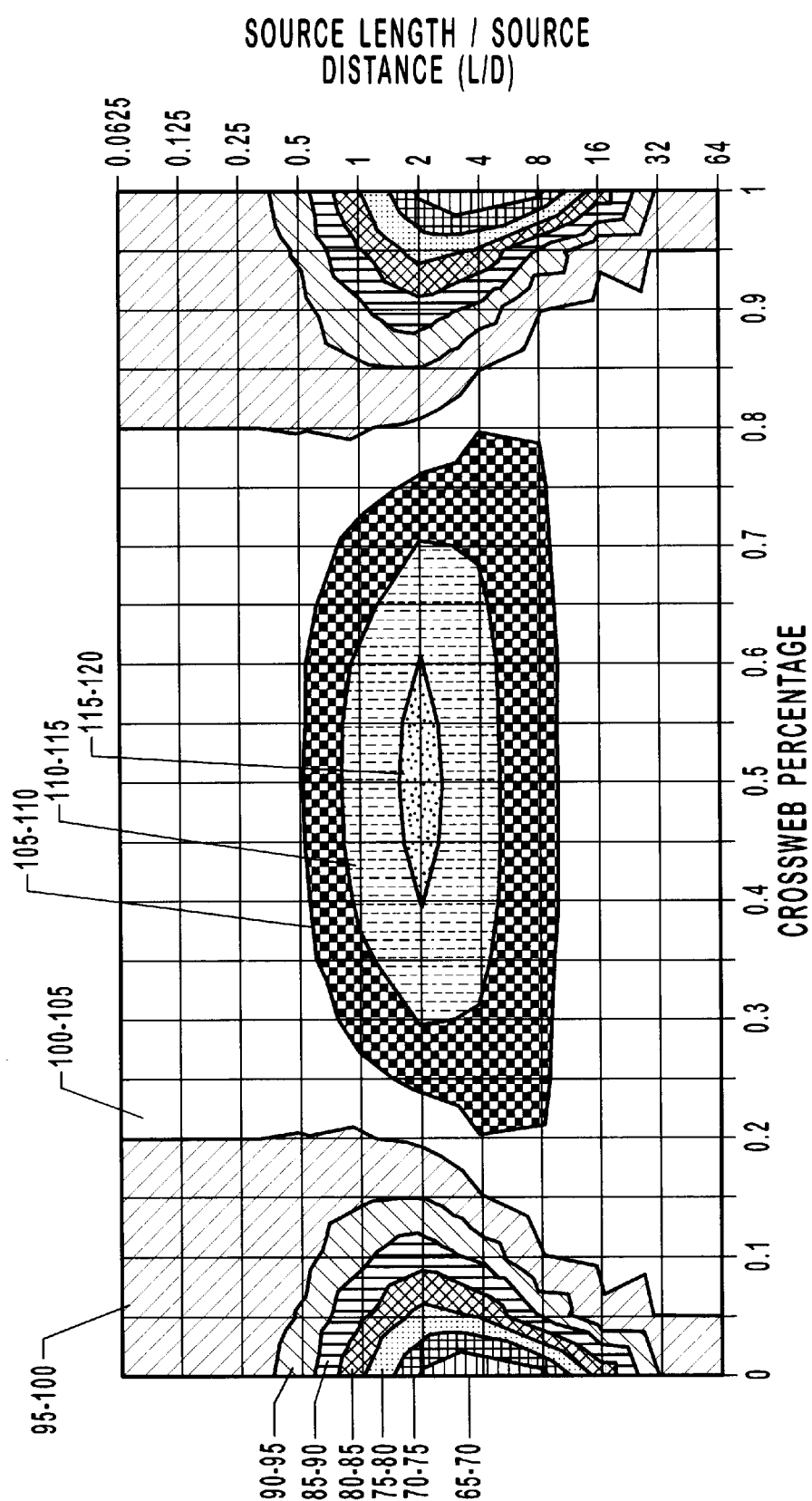
FIGS. 4A and 4B are graphs illustrating a predictive model for cross web coating thickness uniformity as a function of L/D ratio.
Figure 4B:
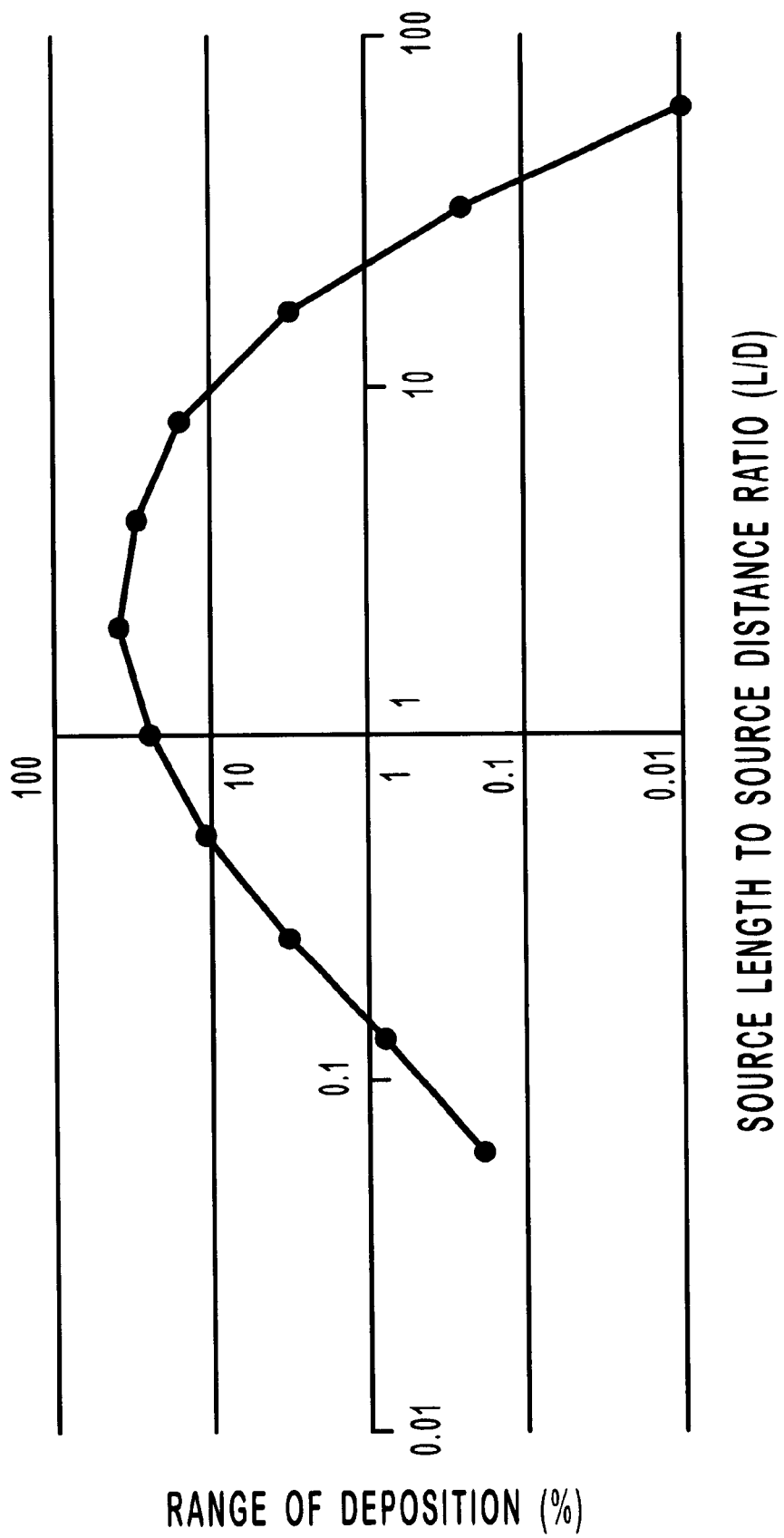
Figure 5:
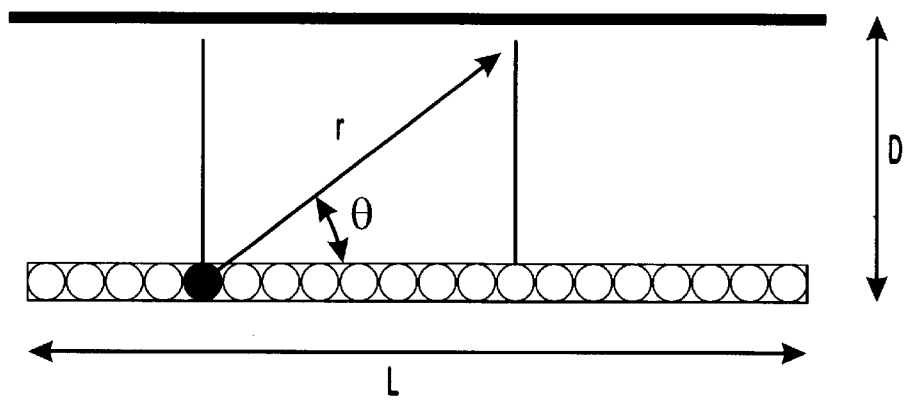
FIG. 5 illustrates the geometry used by the predictive model.

The optimum ratio of L/D is illustrated in FIGS. 4A and 4B, differing substantially from the teaching of the prior art that L/D<1 is desirable and better uniformity is obtained as L/D decreases. The assumption behind this model is that a slot source can be modeled as an array of many point sources. Each of these point sources generates an equal amount of vapor. The vapor ejected from these sources is distributed according to a cosine law, where the probability of a vapor molecule escaping at a particular trajectory is proportional to $\cos^2$. The vapor cloud from a specific source decays according to an inverse square law with distance from the source. The vapor impacting with the substrate is scaled by the cosine of the deposition angle to compensate for the flux. In this model, no scattering is taken into account. A diagram of this geometry is shown in FIG. 5.

The model has a single parameter, which is the ratio of source length (L) to source distance (D) from web (L/D). All results given are dimensionless. The deposition is expressed as a percentage of maximum or average. The cross web position is specified as a percentage of the length L.

The total deposition (W) at each substrate location is determined by the following summation, where n is large and represents the number of point sources used in the model.

$$W = \sum_{i=1}^{n} \frac{\cos^3\theta}{r^2}$$

FIG. 4A is a contour plot, which graphically shows the level of cross web uniformity that can be expected as a function of the L/D ratio. The different contour regions show the amount of material deposited across the web (in the crossweb direction) as a percentage of the average deposition. Thus, the regions marked "95–100" and "100–105" are essentially uniform at the average deposition, whereas regions with higher or lower percentages represent excessive or insufficient deposition in local regions, i.e., nonuniformity. The plot illustrates the model predictions, in which the best cross web uniformity will occur at either large or small values of L/D.

When L/D is large, the source is very close to the substrate, resulting in a uniform vapor flux and a high utilization of source material. For example, looking at the horizontal line representing L/D=64, the deposition is uniform at 100–105% of the average from 0.05 to 0.95 of the crossweb direction; i.e., over the central 90% of the web. At the edges of the web (<0.05 and >0.95 of the crossweb direction), the deposition is only slightly less, 95–100%. Similarly, at small values of L/D the deposition is uniform. For example, looking at the horizontal line for L/D 0.0625, the deposition is uniform at 100–105% from 0.2 to 0.8 of the crossweb direction (the central 60%), and slightly less at the edges. At small values of L/D, the source is far away from the substrate and acting as a point source.

It should be noted that at moderate values of L/D from about 0.5 to about 8, the cross web uniformity would be very poor, requiring masking for further improvement. Thus, for example, looking at the horizontal line for L/D=1, the deposition is 80–85% from 0 to 0.05, 85–90% from 0.05 to about 0.1, 90–95% from 0.1 to 0.15, 95–100% from 0.15 to 0.2, 100–105% from 0.2 to about 0.27, 105–110% from 0.27 to 0.37, 110–115% from 0.37 to 0.62, and then decreases symmetrically back to 80–85% at the other edge.

FIG. 4B shows an alternative representation of this data. This plot shows the range of uniformity over the center 90% of the substrate for a large range of L/D ratios. With this plot, a given natural source uniformity can be associated with a required L/D ratio to achieve that uniformity. For example, to achieve less than a 1% non-uniformity with a slot source configuration would require an L/D ratio of greater than about 20–25. The experimental agreement with this model will be described further in the Example herein, but can be found in FIG. 11.

Figure 6A:
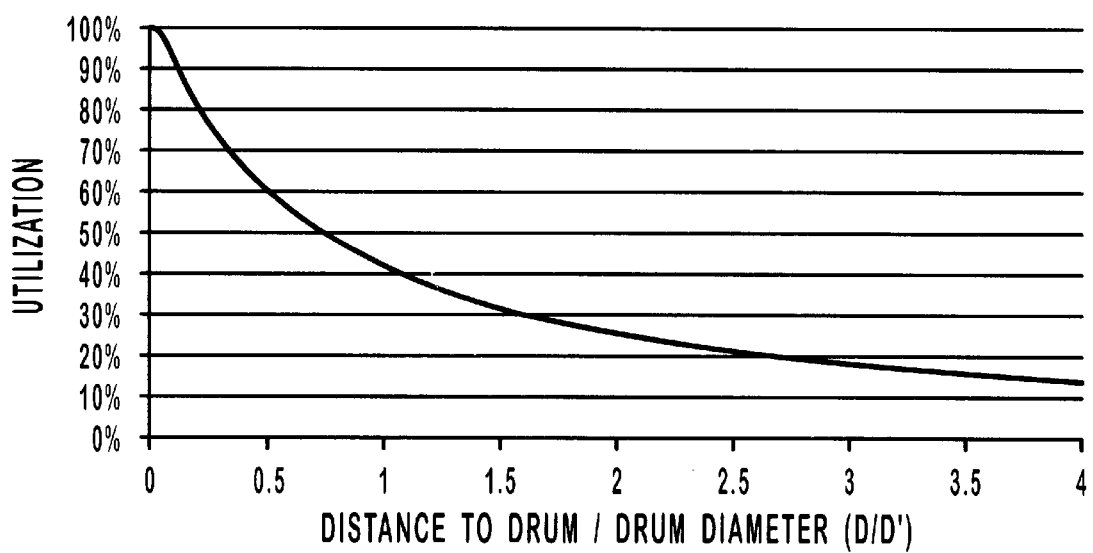
FIGS. 6A and 6B illustrate the model results graphically and further illustrate the model geometry.

The utilization of source material on a round drum can be maximized when the ratio D/D' is maximized, where D is the distance from the chimney outlet to the substrate, and D' is the drum diameter. The results of modeling are depicted in FIG. 6A, which plots the % utilization of the source material that reaches the substrate as a function of D/D'. The model is calculated by solving the integral equation representing the source distribution flux (U) reaching the substrate, integrated over the substrate area:

$$U = \frac{\int_0^{\theta_{max}} \cos^2\theta d\theta}{\int_0^{\pi/2} \cos^2\theta d\theta}$$

Figure 6B:
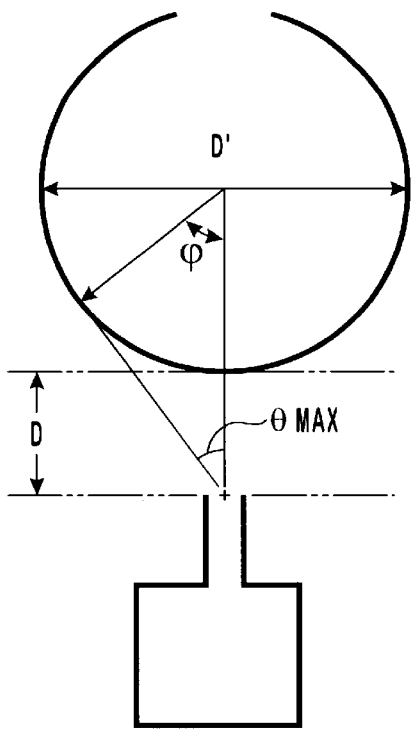

Referring to FIG. 6B, $\theta$ is the angle of incidence having a maximum value $\theta_{max}$ representing the maximum angle at which material leaving the source reaches a portion of the drum. The angle $\theta_{max}$ is defined by a line from the chimney outlet to a point tangent to the drum surface, and is given by:

$$\theta_{max} = \tan^{-1}\frac{D'\sin\varphi}{2D + D' - D'\cos\varphi}$$

where D and D' are as defined above, and $\phi$ is the angle of tangency with respect to the drum, given by:

$$\varphi = \cos^{-1}\frac{D'}{2D + D'}$$

Integrating the equation, the fraction of source material that is utilized or deposited on the substrate is given by:

$$U = \left(\frac{2}{\pi}\right)\theta_{max} + \left(\frac{1}{\pi}\right)\sin(2\theta_{max})$$

As an ideal model, which does not account for source vapor loss from leakage of the crucible or source box, back scattering in the deposition zone, or a sticking coefficient less than unity, the model represents a maximum possible utilization, not an absolute result.

With the recognition of the significance of these variables, the present invention provides preferred configurations of the crucible and chimney structures to provide for their spatial and temporal stability. Specifically, the chimney should not distort in shape nor vary in distance from the drum or substrate during a coating run, which would modify W1 and D. Shape distortion has been avoided by stiffening the upper edge of the chimney with flared edges 94, as shown in FIG. 3A. Alternatives are ribs or other structures that are known to prevent distortion from thermal expansion of a metal sheet, or using thermal expansion joints between source components.

In order to prevent reduction in D or W1 by the condensation of solid source material, either within or on the chimney, the chimney is optionally heated. The heating source can be either supplemental heating elements or a common heating element. It will be appreciated by those skilled in the art that if the chimney is heated by conductive heat transfer from the crucible, then the chimney temperature need only increase to a temperature at which the sticking coefficient of the source material vapor is sufficiently low. This requirement is therefore source material specific, and can readily be evaluated by varying the power to a supplemental heater such that a coating deposit does not form on the chimney 66 surfaces. This prevents a deposited coating from forming and acting as a physical mask to the coating of substrate 72.

Typically the distance D between the top of the chimney 66 and the substrate 72 is about 7/16 in.

Returning to FIG. 3A, flow restricting baffle 74 preferably has holes of about 2 mm in diameter at a 1 cm×0.5 cm center-to-center spacing, resulting in an open area of about 7%. The floating baffle 76 has holes 78 that are smaller than the source material 64 particles, with the holes typically having a diameter of about 2 mm spaced at about a 5 mm center-to-center spacing, for an open area of about 12%.

The configuration of holes 78 in floating baffle 76 has a spaced relationship with flow restricting baffle 74, to substantially avoid line of sight transmission of spatter particles from source material 64 into chimney 66. The floating baffle 76 does not have any holes in the region immediately perpendicular to the holes in flow restricting baffle 74.

Further screening of spatter particles is achieved by adjusting the flow restricting baffle 74 hole size and orientation. Mesh screen may be adapted to form flow restricting baffle 74. The flow restricting baffle characteristics can be readily optimized for the spatter characteristics of different source materials by combining multiple screens or forms of punched metal sheet.

Figure 7:
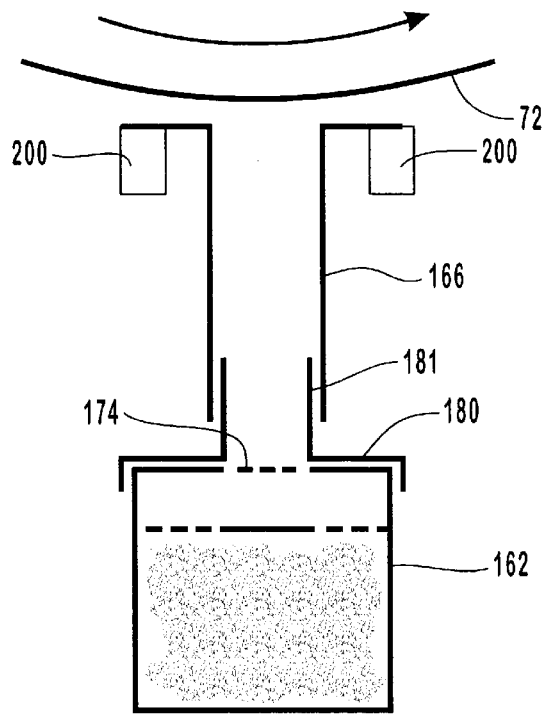
FIG. 7 is a cross-sectional schematic view of a deposition apparatus according to another embodiment of the invention.

FIG. 7 is a cross-sectional schematic view of a deposition apparatus according to another embodiment of the invention, which has an alternative crucible, chimney, and substrate configuration. This configuration substantially stabilizes the width (W1) of a chimney 166 and spacing (D) from a substrate 72. An exit opening of a crucible lid 180 is formed by an integral conduit 181. The chimney 166 is mounted in a coating chamber (not shown) by a bracket 200 and loosely fits over conduit 181, which forms the exit of crucible lid 180. In this embodiment, crucible lid 181 contains a flow restricting baffle 174. Heat conduction from a crucible 162 to chimney 166 is minimized, reducing the chimney temperature and preventing thermal distortion of the chimney shape or opening. Uniformity is thus improved by the rigid positioning of the chimney outlet.

Figure 8:
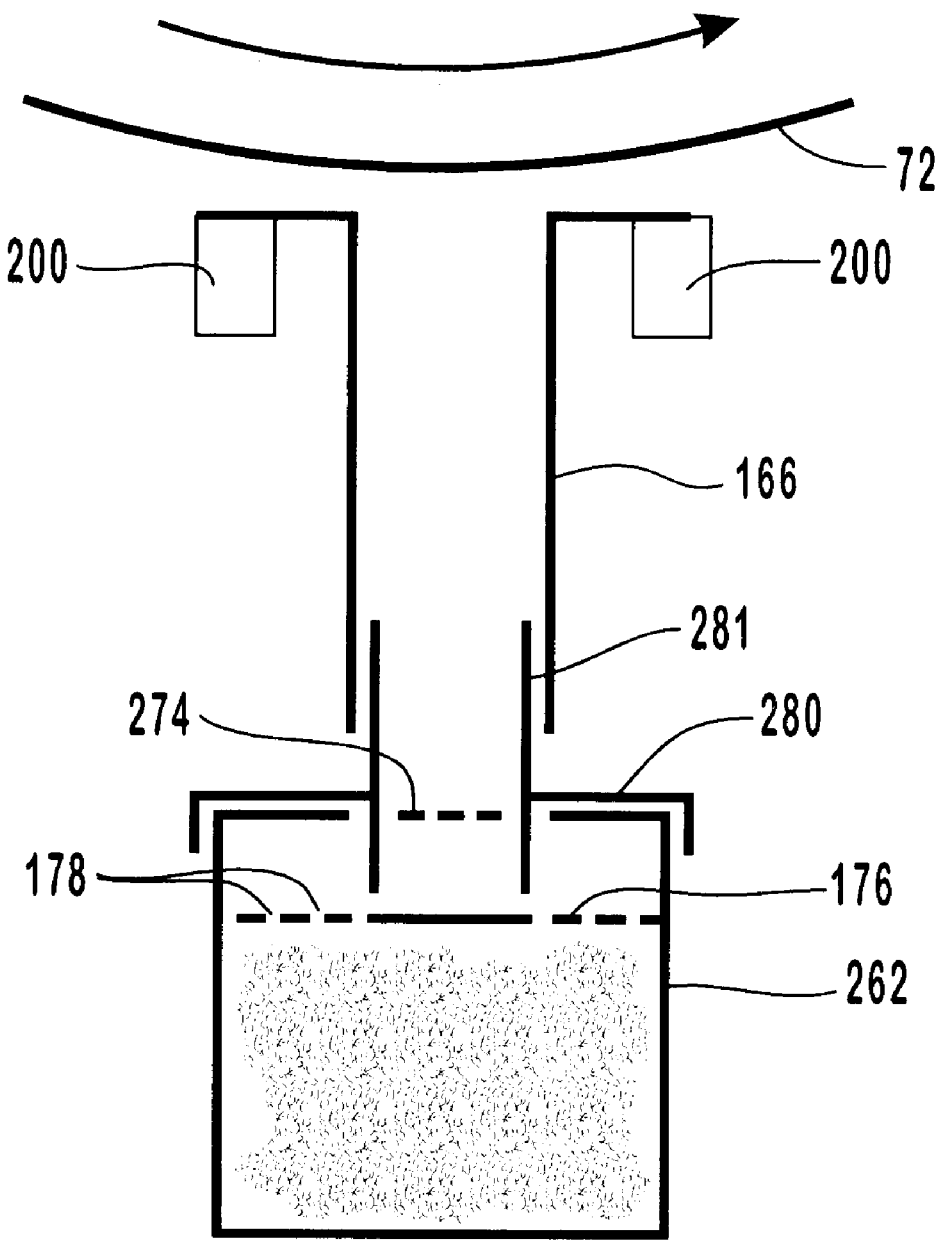
FIG. 8 is a cross-sectional schematic view of a deposition apparatus according to an additional embodiment of the invention.

FIG. 8 illustrates an alternative embodiment of the deposition apparatus of the invention having elements similar to the embodiment of FIG. 7, including a chimney 166 mounted in a coating chamber by a bracket 200. The embodiment of FIG. 8, however, has an alternative arrangement of a flow restricting baffle 274 with respect to chimney 166. As shown in FIG. 8, the openings of flow restricting baffle 274 may be suitably provided on a surface of an integral conduit 281 of a lid 280 that extends into a crucible 262. This substantially eliminates a "line of sight" path between any openings in chimney 166 and the openings 178 in a floating baffle 176, substantially preventing spattered particulate from entering chimney 166.

Figure 9A:
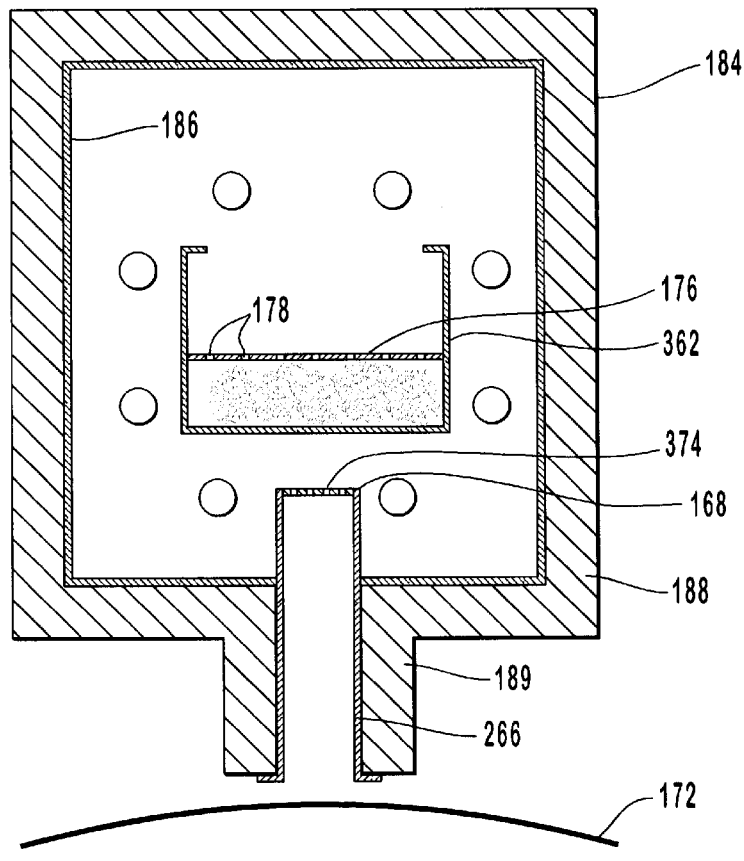
FIGS. 9A–9D are schematic cross-sectional views of various alternative embodiments of the invention, wherein the vapor flux is directed either downward or horizontally.

FIGS. 9A–9D are schematic cross-sectional views of various alternative embodiments of the invention for directing the vapor stream (horizontally or vertically) and independently controlling the chimney temperature. In FIG. 9A, a chimney 266 is not attached to a crucible 362, but has its vapor inlet end 168 connected to the cavity formed between crucible 362 and a metal heat shield 186. The chimney 266 penetrates metal heat shield 186 and insulating material 188, which form a source box 184, and the containment and cooling vessel (not shown in this figure) at the bottom of the source. This configuration results in a downward flow of source material vapor onto the top of a horizontally disposed substrate 172. A flow restricting baffle 374 is still required, and is exposed on the vapor inlet end 168 of chimney 266. A crucible lid, not shown, is optional, depending on the configuration of holes 178 in a floating baffle 176, which can be disposed in a cooperative relationship thereto, preventing particulate ejected from the top of crucible 362 from entering chimney 266 at a velocity sufficient to reach substrate 172. Another optional variation is also illustrated, in which additional insulating material 189 surrounds chimney 266 to maintain the chimney near the source material temperature, preventing a coating deposit from forming within the chimney.

Figure 9B:
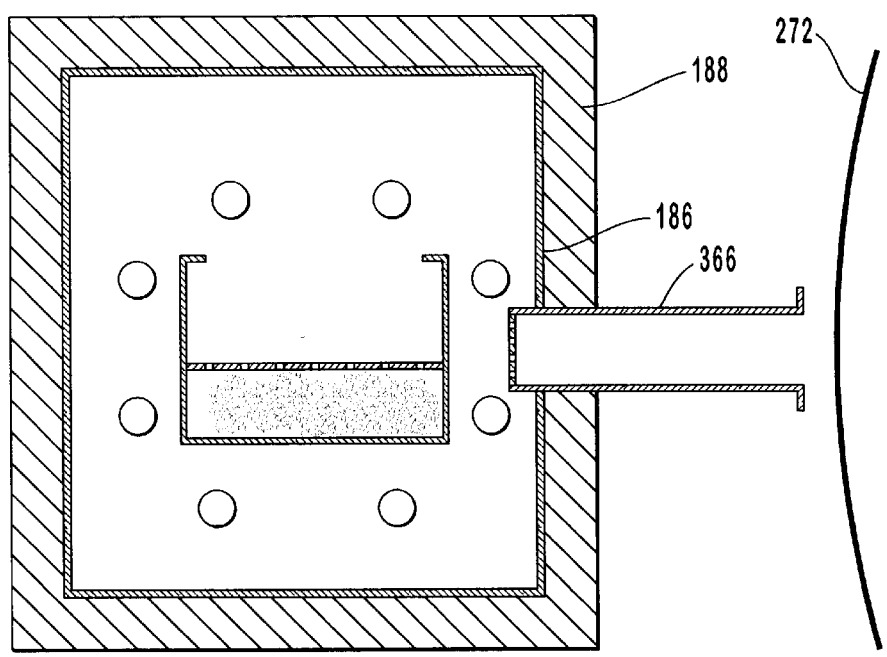

In FIG. 9B, a chimney 366 is disposed horizontally, penetrating metal heat shield 186, insulating material 188 and the containment and cooling vessel (not shown), at their respective side walls. This configuration results in a horizontal flow of source material vapor onto the surface of a vertically disposed substrate 272 being translated in a horizontal direction.

It may be necessary to increase the chimney temperature to prevent deposition either inside the chimney or on the outlet surface. As will be recognized by one of skill in the art, the preferred chimney temperature is specific to both the source material and the deposition conditions. The chimney temperature can be increased by exposing a greater portion of the chimney's length to the heater elements within the source box, by adding heater elements, by reducing the chimney length, by re-positioning the crucible, and the like.

Figure 9C:
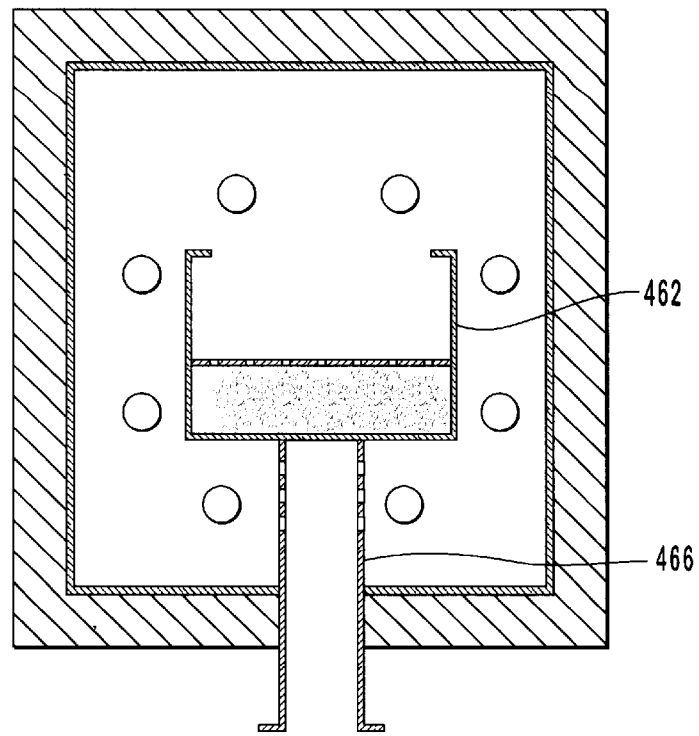
Figure 9D:
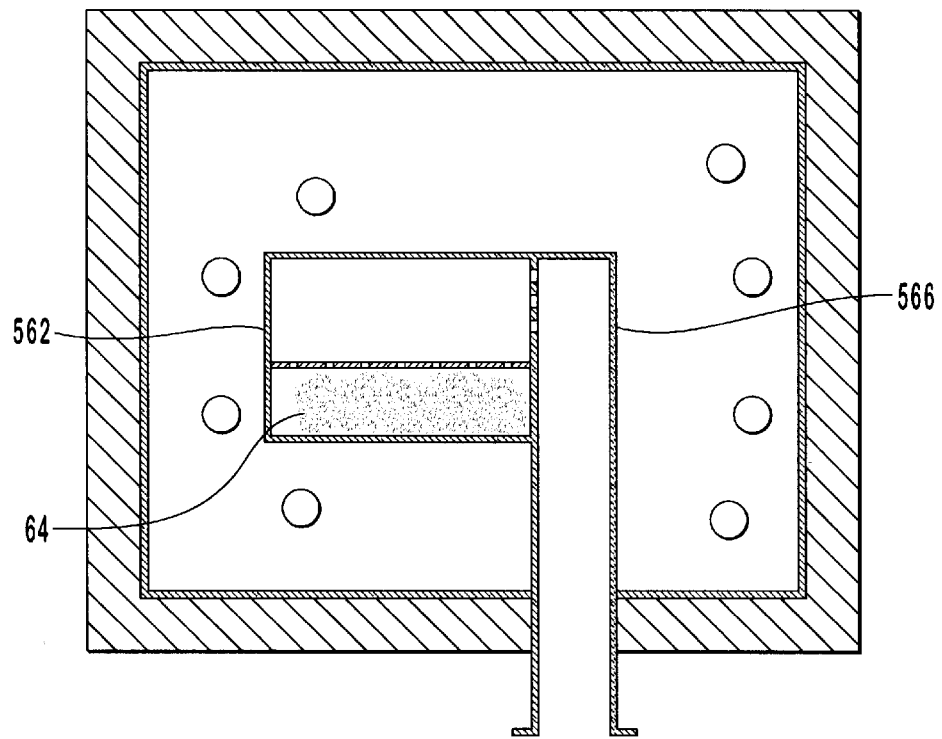

FIGS. 9C and 9D illustrate further alternative embodiments having particular utility when it is necessary to reduce the temperature difference between the chimney and the source material in the crucible. In FIG. 9C, a chimney 466 is thermally coupled to a crucible 462. Thermal coupling will reduce the chimney temperature, when the chimney is hotter than the source material, as crucible 462 is cooled by evaporation of the source material. FIG. 9D illustrates an embodiment for use when it is necessary to prevent the source vapors from over-heating, by direct exposure to the heating elements. A chimney 566 is connected directly to a crucible 562 at a point above the source material 64, thus fully containing the source vapor and directing it downward. The embodiment of FIG. 9D can be modified for horizontal deposition.

It should be noted for the above described embodiments that when the coating source material is molten within the crucible, the floating baffle is generally not required. When a liquid evaporates from the source it is permissible for vapor to condense as liquid on the interior walls of the chimney, in which case it will flow back down into the crucible.

Figure 1A:
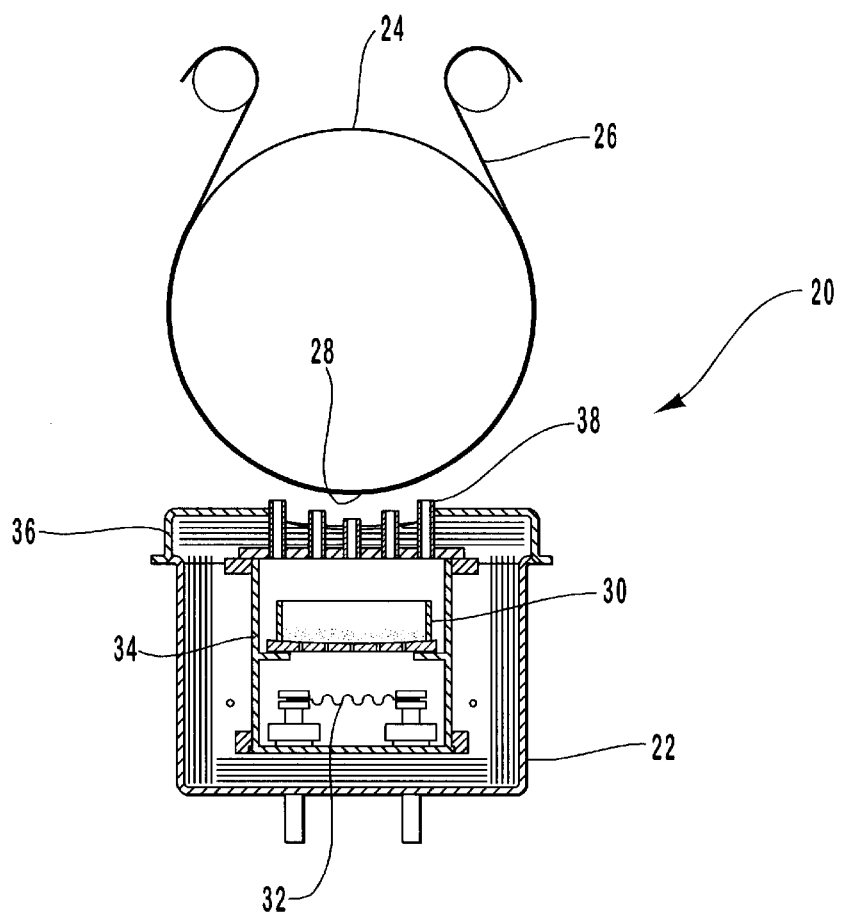
FIGS. 1A–1C illustrate a prior art source in cross-section (FIG. 1A) and perspective views (FIGS. 1B–1C)
Figure 1B:
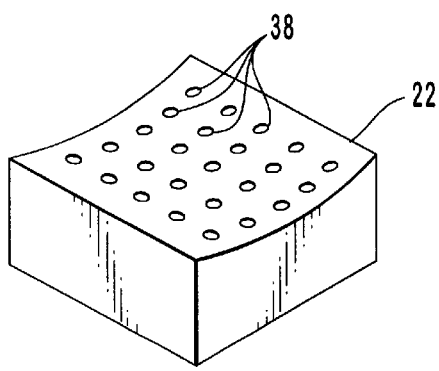
Figure 1C:
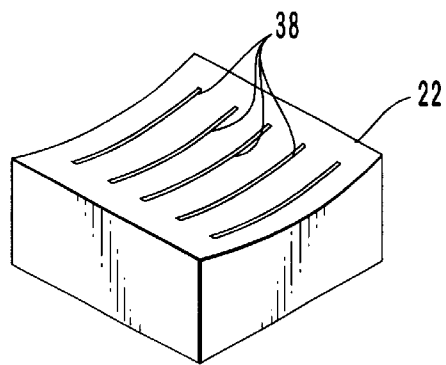
Figure 2A:
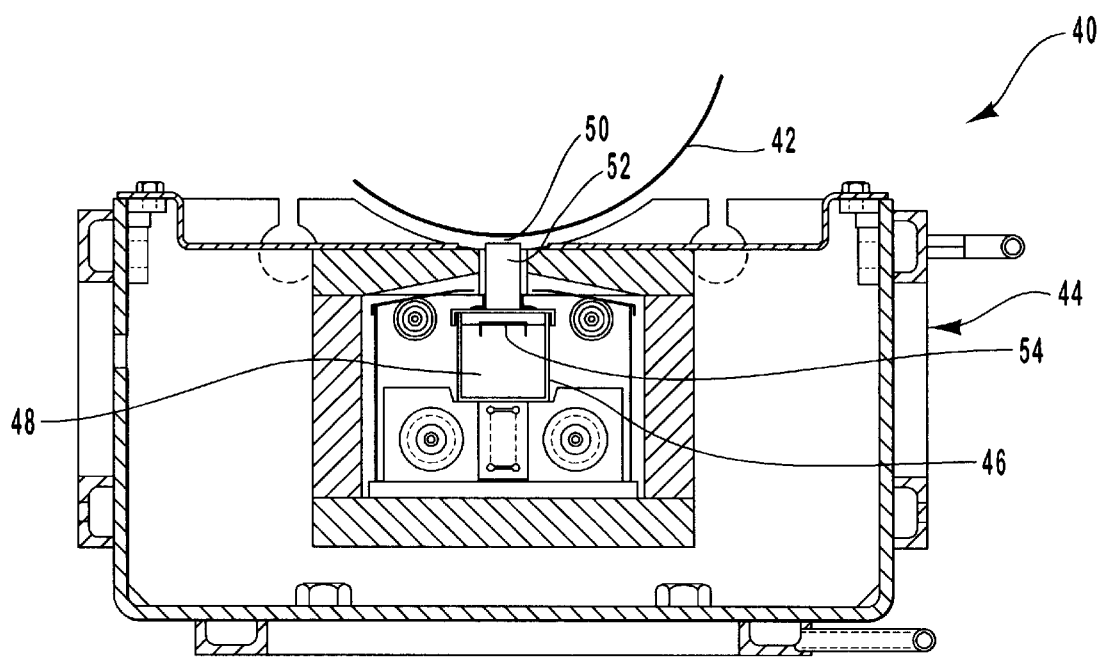
FIGS. 2A and 2B illustrate a prior art source in cross-section and exploded views, respectively.
Figure 2B:
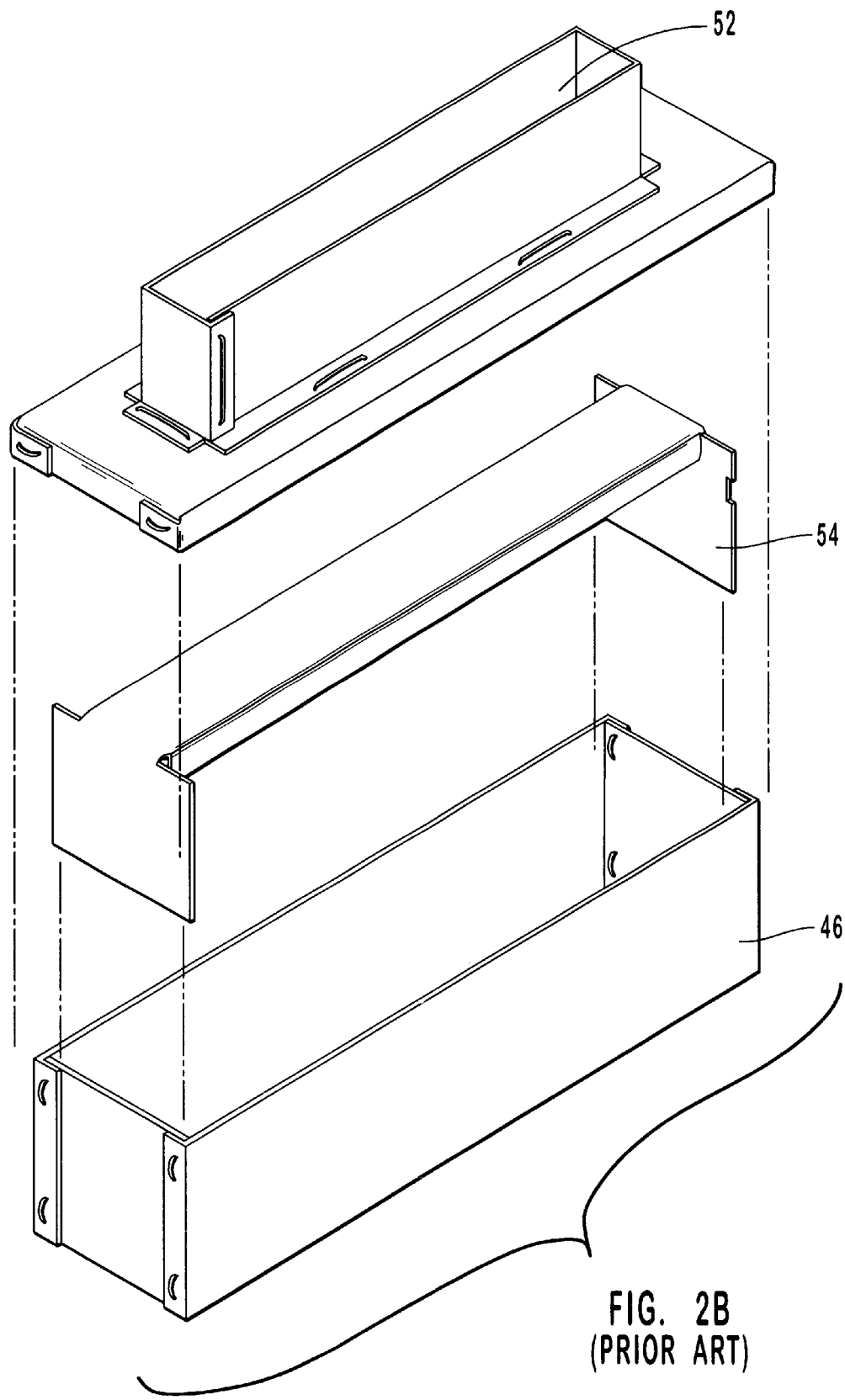
Figure 10:
FIG. 10 is a drawing from a photograph of a multi-layer coating produced by a prior art source illustrating non-coated areas, which result from approximately 1 cm diameter particulate shadowing the substrate.

Normally the ejected particulate, or spatter, is microscopic in size and will increase the roughness of the film surface in conventional processes, which can, under extreme conditions, result in a hazy appearance of the coated substrate. Occasionally, the spatter particles are sub-millimeter in size, thus clearly visible to the naked eye. This is generally acceptable for applications wherein the final film product is laminated with adhesive either inside glass panels or onto the surface of another substrate. However, for computer display applications that have a resolution of less than about 0.25 mm, even spatter particles or defects less than a millimeter in diameter would not be acceptable. Under the highest deposition array conditions, the particles ejected from zinc sulfide are significantly larger, about 5–15 mm in diameter, and roughly shaped. When these larger particles hit the substrate, they shadow the substrate from the instantaneous vapor flux, which results in large visible streaks of uncoated substrate. FIG. 10 illustrates by way of a drawing from a photograph a multilayer coating produced by the prior art source shown in FIG. 2 and described above. The streaks are outlined and numbered 1–8. The particles and the resulting defects range in size from 5 to 20 mm in diameter. These defects are clearly unacceptable for almost any end use application.

Figure 11A:
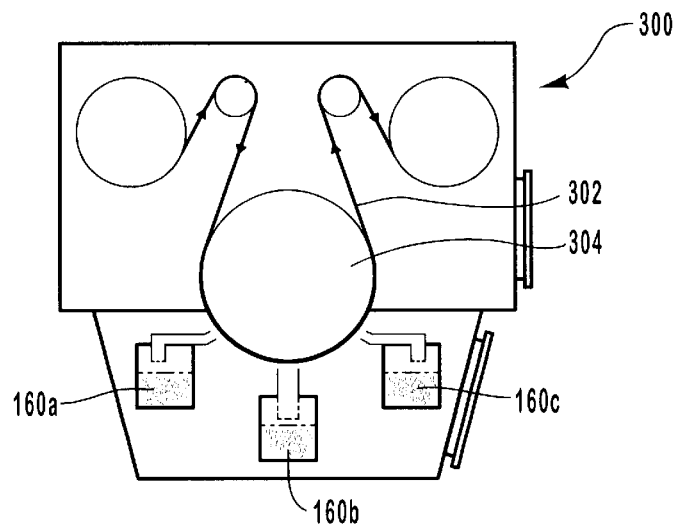
FIGS. 11A and 11B are schematic views of additional embodiments of the invention, wherein a plurality of sources is utilized in series in a vacuum coating machine for web coating (11A) and coating discrete flat substrates (11B)
Figure 11B:
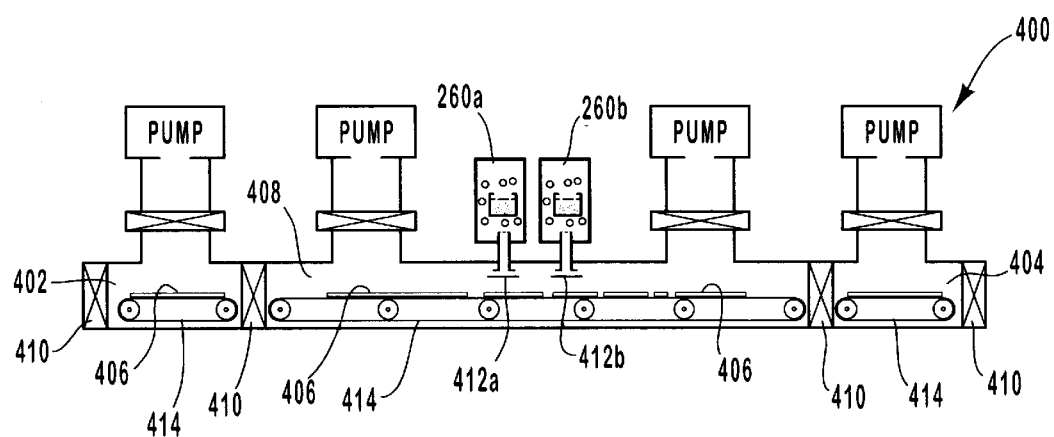

FIGS. 11A and 11B are schematic views of coating systems according to the invention that utilize a plurality of sources in series in a vacuum coating machine. The sources utilized in the coating systems can be selected from any of the embodiments previously described. In FIG. 11A, a plurality of sources 160a, 160b and 160c are utilized in series in a vacuum coating machine 300 for coating a continuous web 302, arranged around a drum 304, maximizing the number of deposition zones.

In FIG. 11B, a series of source boxes 260a and 260b are arranged horizontally in a coating machine 400 having load lock entry and exit chambers 402 and 404 for coating flat discrete parts, such as glass sheets 406. The entry and exit chambers 402 and 404 are isolated from a processing chamber 408 by vacuum locks 410. Each source 260a and 260b is provided with a separate heater and heater control circuit (not shown) and shutters 412a and 412b. The shutter prevents deposition onto an empty portion of the substrate carrier. The glass sheets 406 are transported by a series of conveyor belts 414.

Figure 12:
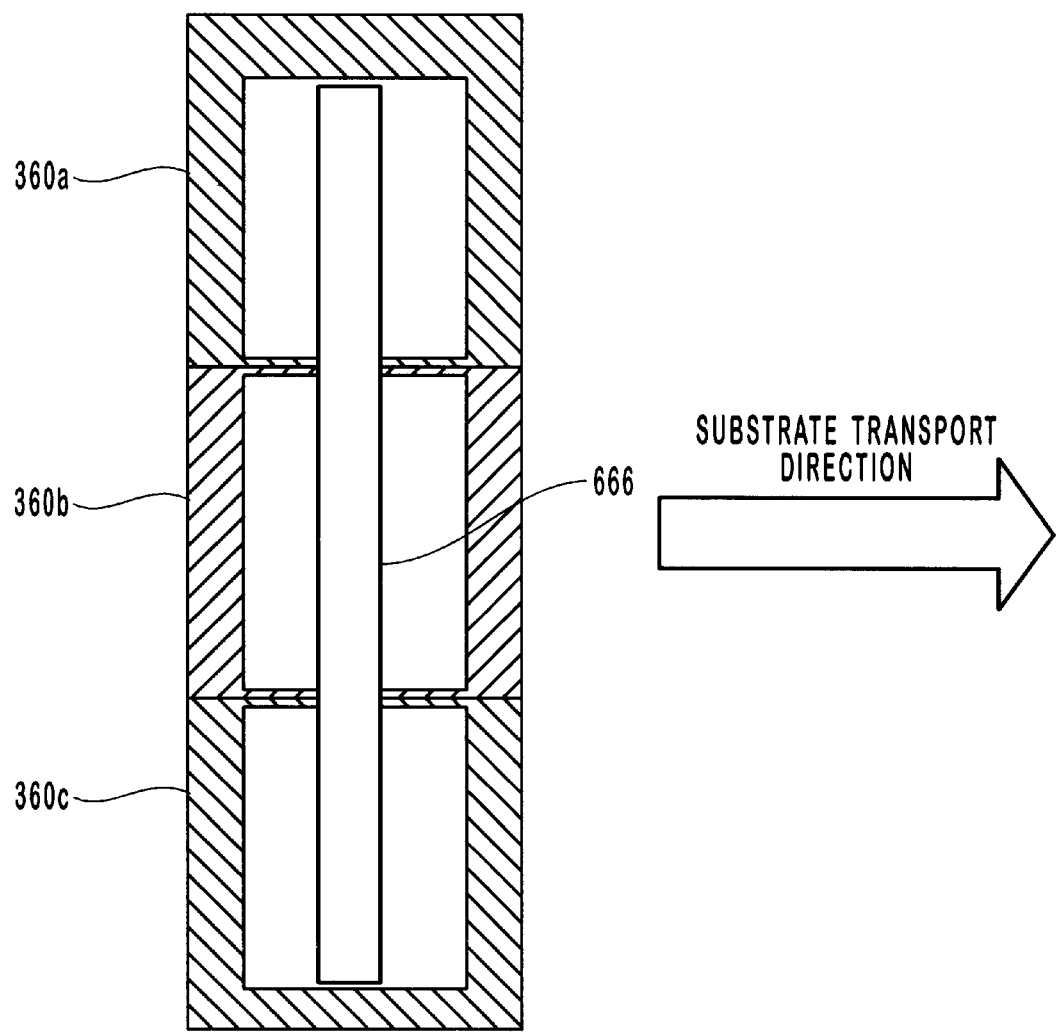
FIG. 12 is a schematic plan view of an another embodiment of the invention, wherein a plurality of sources communicates with a common chimney in a vacuum coating machine.

FIG. 12 is a plan view of a further embodiment of the invention wherein a plurality of sources 360a, 360b and 360c are utilized in parallel in a vacuum coating machine (not shown). Each source 360a, 360b and 360c is provided with a separate heater and heater control circuit (not shown). The three sources communicate with a common chimney 666.

Figure 13A:
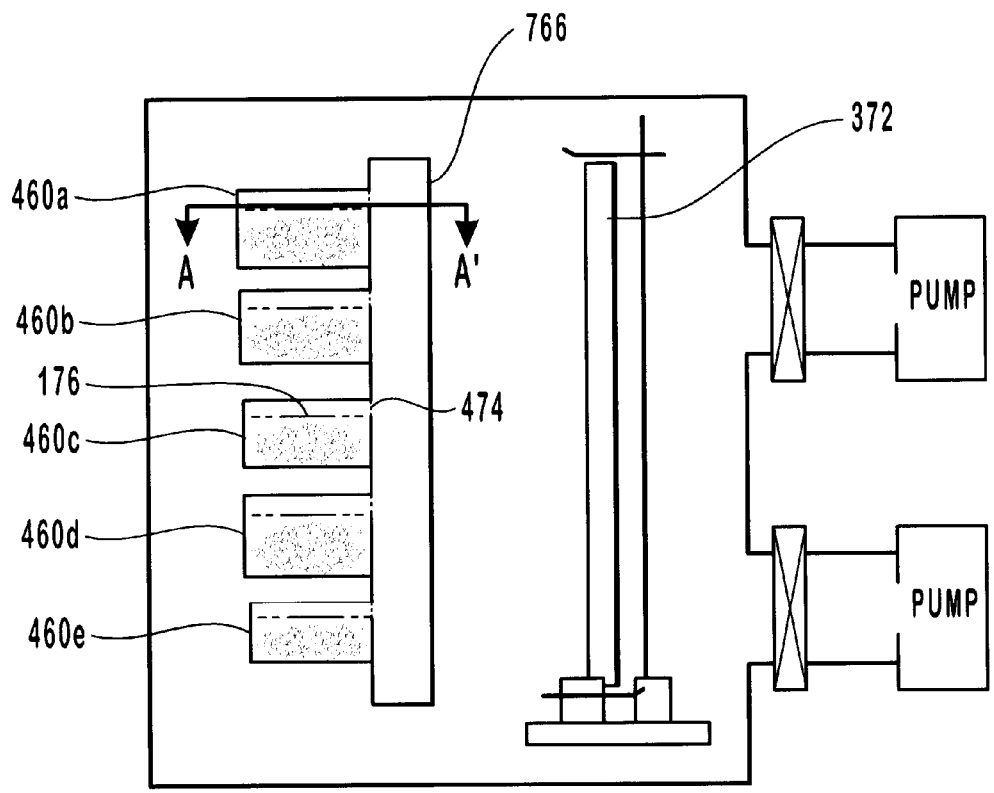
FIGS. 13A and 13B show schematic views of a further embodiment of the invention, wherein several sources connect to a common chimney, the chimney directing a uniform vapor flux onto a vertical substrate.
Figure 13B:
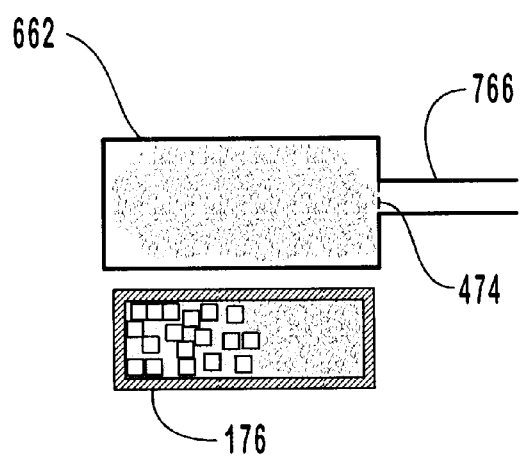

FIG. 13A is a cross sectional view of an additional embodiment of the invention, wherein a plurality of sources 460a–460e communicate with a common chimney 766 to deposit a vapor stream onto a vertical substrate 372. A vapor outlet slot, not shown, is disposed vertically to allow for deposition on a substrate 372 that is moving in the vertical direction. FIG. 13B is a cross-sectional view along section line A–A' in FIG. 13A, showing a crucible 662 along with a floating baffle 176 for use therein, and a flow restricting baffle 474 between crucible 662 and chimney 766.

Figure 14A:
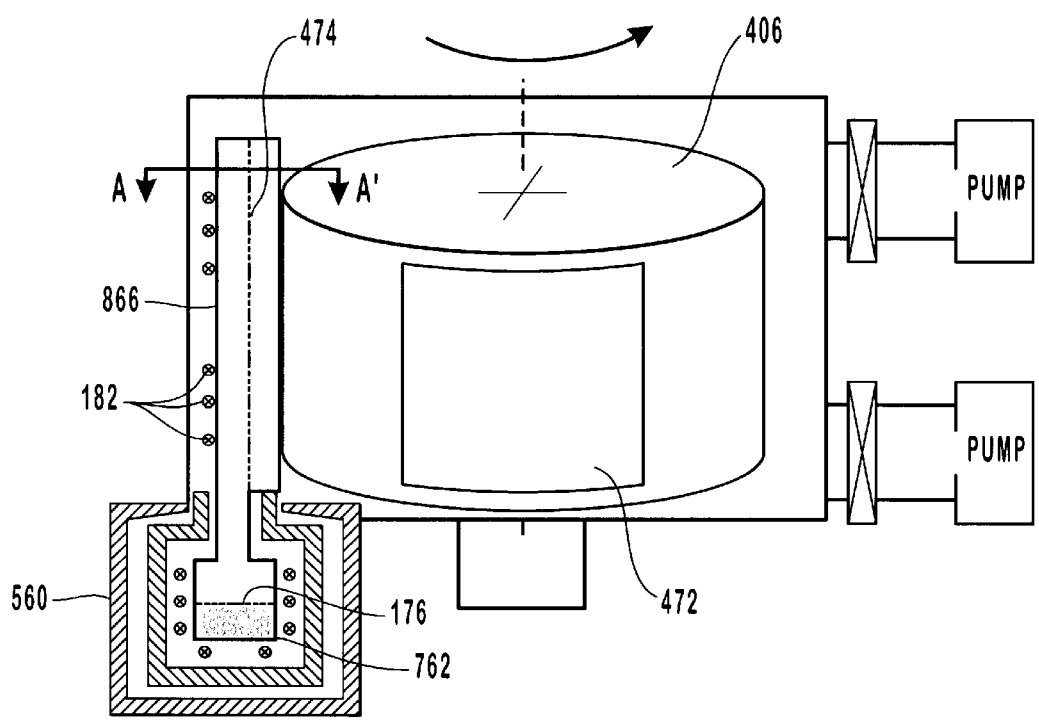
FIGS. 14A and 14B show schematic views of another embodiment of the invention, wherein the chimney has a rectangular slot opening for directing a uniform vapor flux onto a vertical substrate.
Figure 14B:
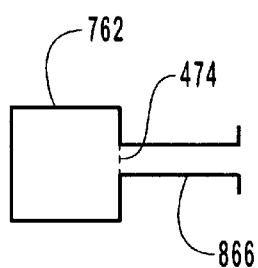

FIG. 14A is a cross-sectional view of a further embodiment of the invention wherein a coating is deposited from a single source 560, having a single crucible 762 with a floating baffle 176. A chimney 866 extends vertically, and has a vertically disposed flow restricting baffle 474. The chimney has a vertical opening (not shown) to deposit a coating material onto a substrate 472, which is held vertically and transported vertically, in this case on a rotating drum 406 utilized as the substrate carrier. A series of heater elements 182 are provided to maintain chimney 866 at a temperature sufficient to prevent the coating material from depositing within the chimney. FIG. 14B is a cross-sectional view along section line A–A' in FIG. 14A, showing chimney 866 and crucible 762 with flow restricting baffle 474 therebetween.

The aforementioned combinations of elements in the various embodiments of the invention, result in sources providing a high deposition rate, high thickness uniformity, and avoidance of spatter. These advantages are mutually achieved by a combination of source design features in a cooperative relationship with the substrate. Notably, the present invention demonstrates advantages over state-of-the-art coating technologies in deposition rate, coating uniformity, material utilization, energy consumption, process time, and coating quality. For example, prior to this invention, the coating industry lacked the capability of producing high surface quality optical coatings, such as coatings comprised of zinc sulfide (ZnS), having a uniform color over the width of standard plastic web substrate. The invention provides the capability for achieving coating thickness uniformity of better than about 5% over a 40-inch or greater substrate width, both perpendicular and parallel to the substrate transport direction.

The present invention solves the problem of simultaneous improvement in coating quality and economy, especially in coatings containing multiple layers. Specifically, it enables the deposition of high quality coatings at a high rate. Coatings of zinc sulfide are of particular note as an example of a material with high refractive index that can be deposited at high rates with high coating quality by using the present invention. This is advantageous since zinc sulfide is a useful high index material for constructing a wide variety of optical thin-film coating designs. Other examples of coating materials that can be deposited by the apparatus of the invention are chromium (Cr), silicon dioxide, magnesium fluoride ($MgF_2$), and cryolite; this list of materials is by no means exhaustive.

The apparatus of the invention is particularly useful in depositing zinc sulfide, magnesium fluoride, and various oxides of silicon ($SiO_x$), such as silicon dioxide ($x \approx 2$), silicon monoxide ($x \approx 1$) and suboxides ($x < 2$), onto a substrate comprising plastic film without excessive heating and distorting of the film. The apparatus may also be used to deposit materials that evaporate from molten or liquid state.

The present invention is particularly suited for making a flexible film having an optical interference coating, with the coating comprising at least one layer of material such as those described above. The at least one layer of the coating has a thickness that varies by less than about 3%, and preferably by less than about 1.5%, across a distance of at least about 12 inches, and preferably across a distance of at least about 40 inches. In a preferred embodiment, a flexible film made according to the invention has a thickness that varies by less than about 1% across a distance of at least about 60 inches. When the flexible film is formed such that the at least one layer of the coating is deposited from a solid source material by sublimation, the coating is essentially free of defects of average diameter greater than about 10 mm, preferably greater than about 5 mm, and more preferably greater than about 1 mm, caused by ejection of particulates from the source material.

The present invention addresses the growing market need for energy (solar) control film in automotive and architectural markets. Energy control films can be laminated between window glass or placed within an evacuated space between window panel frames. A highly uniform coating is required to achieve a uniform and aesthetically pleasing reflected or transmitted color for many of these applications. Solar control films used for automotive glazing should exhibit uniformity of both the reflected and transmitted color across a polyester web 12 or more inches wide. This will generally require that each high index material layer have a thickness that varies less than about ±3%, preferably less than about ±1.5%, and more preferably less than about ±1%. Solar control films for architectural glass usually require color uniformity across a polyester web greater than about 20 inches wide, preferably greater than about 40 inches wide, and more preferably greater than about 60 inches wide. The present invention provides the capability for meeting the above requirements for solar control window film, solving the problem of making multi-layer coatings with acceptable uniformity, optical performance, and cost. The coatings made by the invention have optical constants desirable for application in solar control films, wherein a near bulk property refractive index is obtained without significant optical absorption.

The present invention is particularly useful in depositing zinc sulfide as an optical coating material with a refractive index greater than about 2.2 and an absorption coefficient less than about 0.01, preferably less than about 0.001, and more preferably less than about 0.0003, at a visible wavelength of 550 nm, in a multi-layer solar control coating on a polyester film substrate. Examples of suitable energy control multi-layered coatings composed of zinc sulfide which can be deposited on plastic film or web substrates utilizing the apparatus and process of the invention, can be found in U.S. Pat. No. 4,536,998 to Matteucci et al., and U.S. Pat. No. 5,677,065 to Chaussade et al., the disclosures of which are herein incorporated by reference.

Another suitable optical coating which can be deposited utilizing the apparatus and process of the invention is described in U.S. Pat. No. 4,229,066 to Rancourt et al., the disclosure of which is herein incorporated by reference. The optical coating is a visibly transmitting, infrared reflecting filter that includes zinc sulfide as a high index material, which is advantageous to deposit on silicon type solar cells that frequently come in a fused silica or glass cover sheet.

Other suitable optical coatings which can be deposited utilizing the apparatus and process of the invention include zinc sulfide coatings on plastic film used to form antireflection films which can be laminated to the front face of various information display panels, such as cathode ray tubes and liquid crystal display panels. A further description of such optical coatings is found in EP 539,099 A2, the disclosure of which is herein incorporated by reference.

The apparatus and process of the invention can also be utilized in the formation of various pigment materials, such as those described in the following patents. For example, U.S. Pat. No. 3,123,489 to Bolomey et al., the disclosure of which is incorporated by reference, describes how nacreous pigment can be made by evaporation of ZnS onto a flexible substrate and removal therefrom, forming pigment flakes. U.S. Pat. No. 5,648,165 to Phillips et al., the disclosure of which is incorporated by reference, describes how optically variable flakes and coatings can be produced by depositing a multi-layer coating on a plastic film and then removing the coating from the film. The multi-layer materials are, for example, zinc sulfide and magnesium fluoride or silicon dioxide. This same patent describes how optically variable pigments can be formed using a five-layer symmetrical design of the type:

metal/dielectric/metal/dielectric/metal.

When using the various embodiments of the invention to coat dielectric substrates, such as polyester film or glass, it is necessary to remove static charge buildup on the substrate to deposit high-quality coatings such as a zinc sulfide coating. Without treating dielectric substrates in this manner, the coatings are of lower quality and have a mottled appearance, suggesting it is structurally or chemically inhomogeneous. These generally undesirable characteristics are more prominent as the coating thickness is decreased, corresponding to lower deposition rate. Not wishing to be bound by theory, we believe the film quality is related to the nucleation rate, in that nucleation is suppressed by the residual static charge. A static charge on the substrate would repel one of the ionized species (e.g., Zn when the static charge is positive). Nucleation and growth require that either both ions, or ZnS molecules, are present at the gas-surface interface. The degradation in film quality at the lower deposition rates suggests that either the ionized species are rate limiting or the excess ions become incorporated in the film growing from ZnS molecules, disrupting the film's structure. The static charge is easily removed with a glow discharge on plastic or glass substrate. Metallic or metal-coated substrates, when they are sufficiently conductive, do not accumulate a static charge, obviating the need for a glow discharge treatment.

The following example is given to illustrate the present invention, and is not intended to limit the scope of the invention.

EXAMPLE 1

In this example, a floating baffle and flow restricting baffle were utilized as shown in the embodiment of FIG. 3C. The crucible was formed from a rectangular box having dimensions 2×2×9.5 in. The dimensions of the other source components were:

| | |
|---|---|
| L | 9.5 in. |
| H | 3.5 in. |
| W1 | 0.625 in. |
| Crucible width, W2 | 2 in. |
| Distance from chimney to substrate, D | 0.437 in. |
| Drum diameter, D' | 11.8 in. (30 cm) |
| L/D ratio | 21.7 |
| H/W1 ratio | 5.6 |
| W2/W1 ratio | 3.2 |
| D/D' | 0.037 |

The flow restricting baffle contained five rows of 3-mm holes to prevent. ZnS particulate from being ejected from the source material. The substrate was polyester film having a thickness of 0.002 in. The polyester had been aluminized to facilitate coating thickness measurements. There was no shutter between the source and the substrate, nor was there any masking.

Base pressure was $5 \times 10^{-5}$ Torr. The stability and source uniformity were evaluated at two conditions, denoted "A" and "B". In condition A, 1.4 kW of power was applied to the source, and the web transport speed was 0.5 m/min. In condition B, the power was increased by a factor of 1.66 (a 66% increase in power) to 2.33 kW. The web speed was increased to 3 m/min, to achieve a coating thickness that could be measured with sufficient accuracy.

Figure 15A:
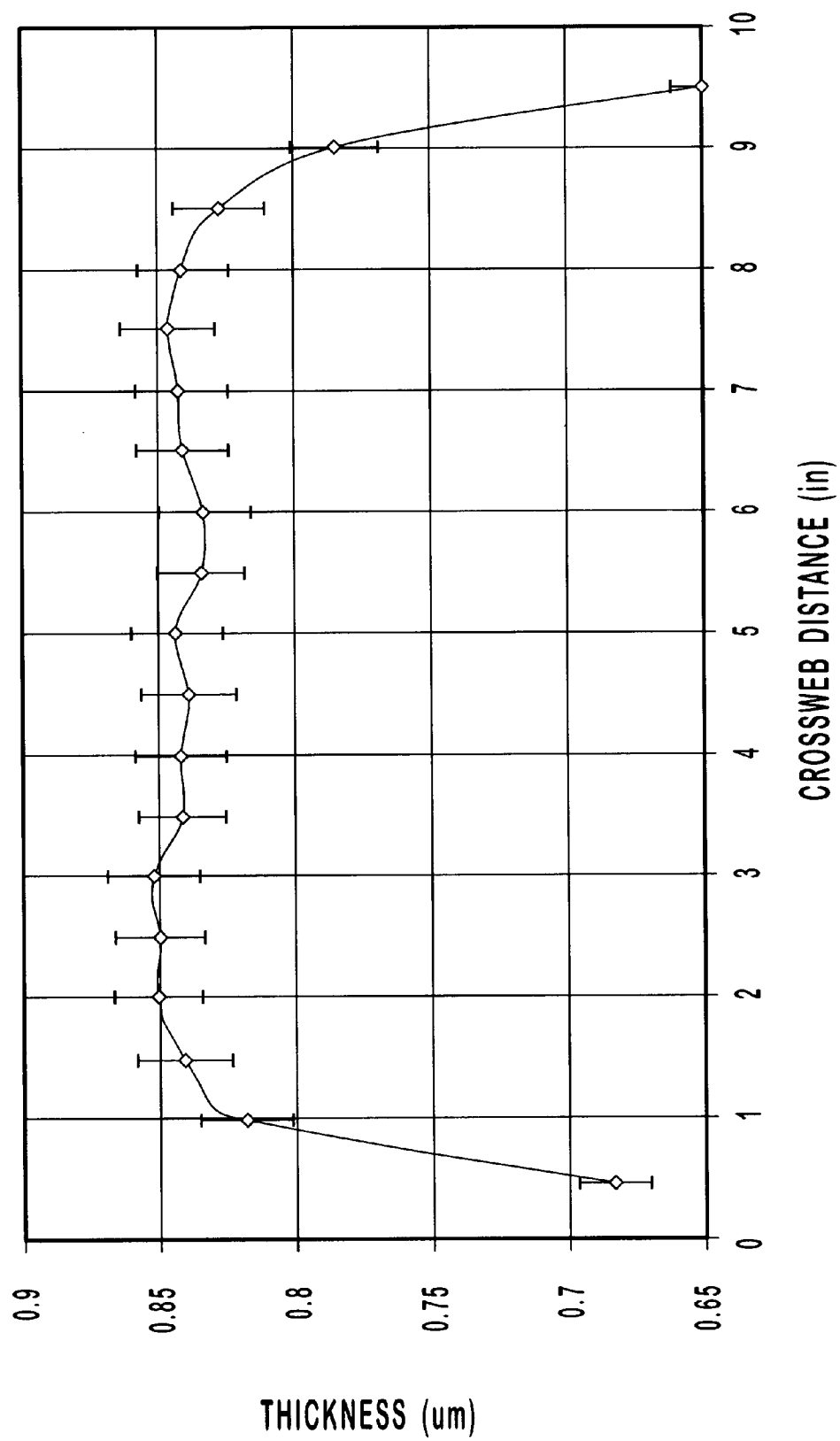
FIGS. 15A and 15B are graphs which compare the observed cross web uniformity of ZnS as deposited with predictive model results.
Figure 15B:
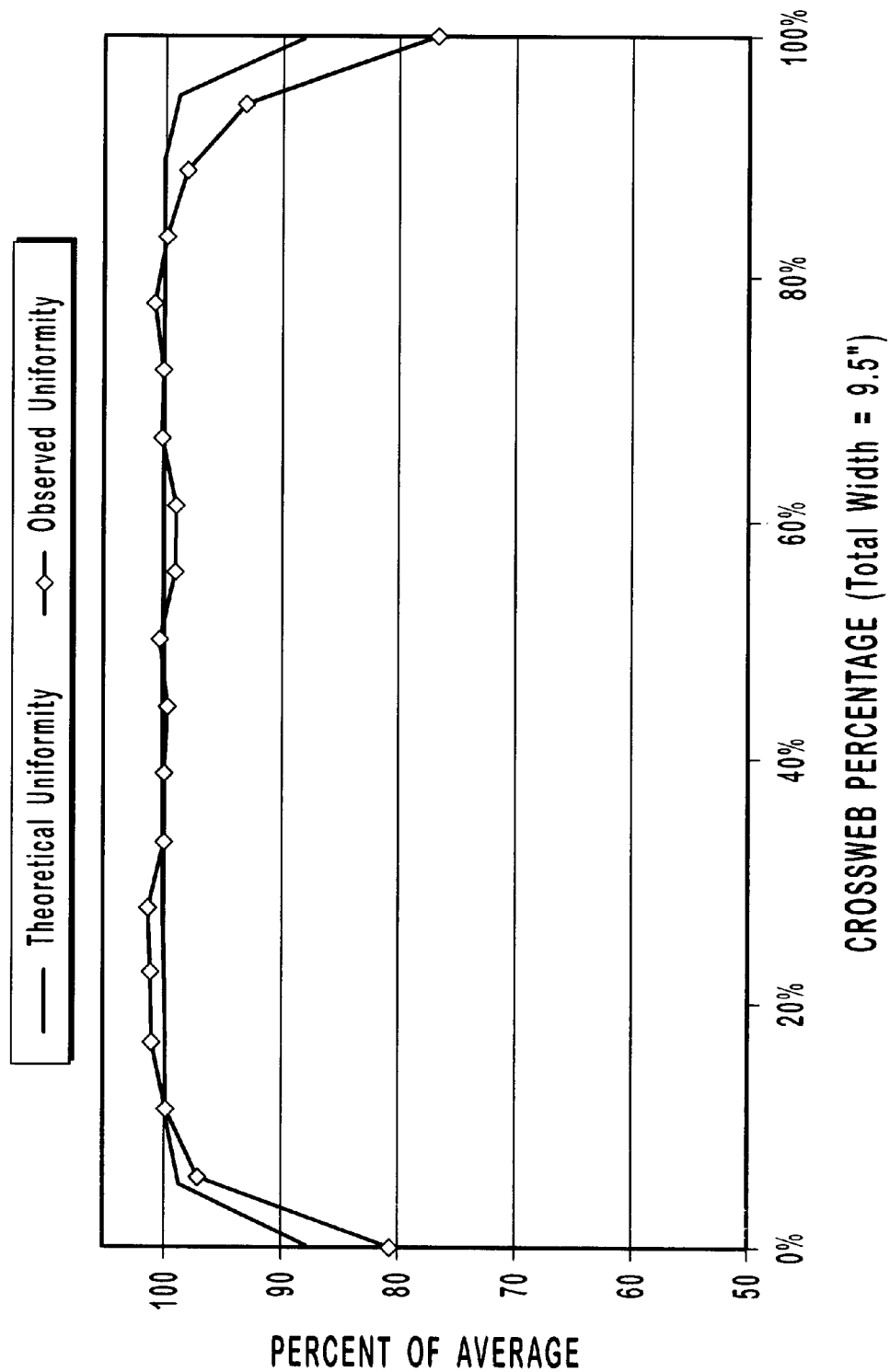

Cross web coating uniformity representative of condition is shown in the graph of FIG. 15A. The coating uniformity was within ±1%, excluding about 1.5 inches at both edges of the polyester film, in excellent agreement with the model for thickness uniformity, plotted as the solid line in the graph of FIG. 15B. The results of the model were above described and shown in the graphs of FIGS. 4A and 4B.

Figure 16:
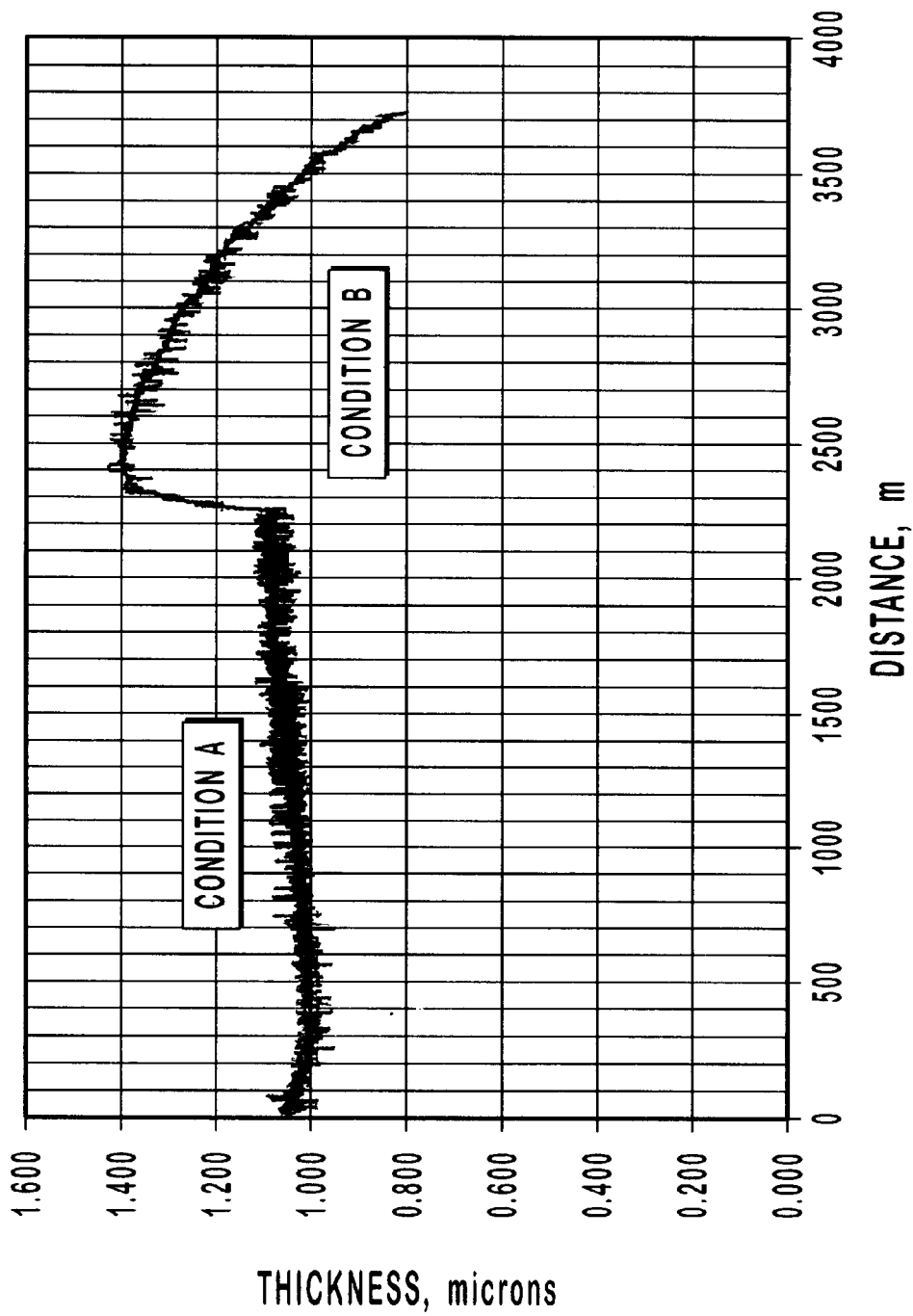
FIG. 16 is a graph which illustrates the observed down web coating thickness uniformity of ZnS.

Down web uniformity for conditions A and B is illustrated in the graph of FIG. 16. The thickness measurement of the ZnS was taken at the center of the web and is plotted against the down web distance, in meters. The average deposition rate in condition A was 0.55 micron/m/min, and in condition B was 3.6 micron/m/min. The high frequency variations are due to instability in the web drive mechanism and are not a characteristic of the process. The longer-term variations in rate, over hundreds of meters, for the duration of condition A and B, are easily eliminated with a conventional control system. The discontinuous rate increase from region A to region B indicates the responsiveness of the source to the heater power, with the deposition rate under condition B (2.33 kW) increasing to about seven times that of condition A (1.66 kW). The subsequent decrease in coating rate, over web distance, in region B is a consequence of the rapid depletion of the source material in the crucible, which occurs over a shorter web distance at the higher deposition. The rate of decrease under condition B appears to be significant with respect to region A only because the web speed was increased by a factor of 6 in condition B. The initial source material charge was about 1 kg of ZnS. At the end of the experiment, about 25 g of ZnS remained in the crucible. The total weight of material deposited on the web during conditions A and B showed that 55% of the ZnS was utilized and deposited on the substrate.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A linear aperture deposition apparatus for coating a substrate, comprising:
   (a) a source box containing a charge of source material;
   (b) a heating element within the source box adapted to heat the source material to produce a vapor of the source material;
   (c) a chimney having at least one inlet in communication with the source box and a rectangular slot outlet for directing the vapor from the source box to the substrate;
   (d) a heating element associated with the chimney to prevent deposition of material onto the internal walls of said chimney;
   (e) a baffle disposed within the source box and configured to restrict the flow of vapor from the source box to the substrate; and
   (f) a containment and cooling vessel disposed around the source box and configured to prevent heating of the substrate.

2. A linear aperture deposition apparatus for coating a substrate, comprising:
   (a) a source box containing a charge of source material;
   (b) a heating element within the source box adapted to heat the source material to produce a vapor of the source material;
   (c) a chimney having at least one inlet in communication with the source box and a rectangular slot outlet for directing the vapor from the source box to the substrate;
   (d) a chimney baffle disposed between the source material and the outlet of said chimney, said baffle being configured to restrict the flow of vapor from the source box to the substrate; and
   (e) a containment and cooling vessel disposed around the source box and configured to prevent heating of the substrate.

3. A linear aperture deposition device as defined in claim 2, further comprising a floating baffle disposed upon the vapor-emitting surface of the source material.

4. A linear aperture deposition devise as defined in claim 3, wherein each of the baffles are provided with holes, and wherein the holes of the chimney baffle and the floating baffle are spaced so as to substantially avoid line of sight transmission of spatter particles from the source material through the chimney.

5. A linear aperture deposition apparatus for coating a substrate, comprising:
   (a) a source box containing a charge of source material;
   (b) a heating element within the source box adapted to heat the source material to produce a vapor of the source material;
   (c) a chimney having at least one inlet in communication with the source box and a rectangular slot outlet for directing the vapor from the source box to the substrate, said chimney being provided with reinforcement to assist to prevent distortion of the shape of the chimney;
   (d) a baffle disposed within the source box and configured to restrict the flow of vapor from the source box to the substrate; and
   (e) a containment and cooling vessel disposed around the source box and configured to prevent heating of the substrate.

* * * * *

UNITED STATES PATENT AND TRADEMARK OFFICE
CERTIFICATE OF CORRECTION

PATENT NO. : 6,367,414 B2
DATED : April 9, 2002
INVENTOR(S) : Witzman et al.

It is certified that error appears in the above-identified patent and that said Letters Patent is hereby corrected as shown below:

Column 8,
Line 54, after "region" change "①" to -- (② --
Line 56, after "region" change "(②" to -- ① --

Column 11,
Line 47, before "ratio" change "LID" to -- L/D --

Column 18,
Line 14, after "prevent" delete the period

Column 20,
Line 10, after "deposition" change "devise" to -- device --

Signed and Sealed this

Twenty-eighth Day of January, 2003

JAMES E. ROGAN
*Director of the United States Patent and Trademark Office*